United States Patent
Ito et al.

(10) Patent No.: US 7,318,183 B2
(45) Date of Patent: *Jan. 8, 2008

(54) DATA STORING METHOD OF DYNAMIC RAM AND SEMICONDUCTOR MEMORY DEVICE

(75) Inventors: Yutaka Ito, Ome (JP); Hidetoshi Iwai, Fussa (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/399,485

(22) Filed: Apr. 7, 2006

(65) Prior Publication Data

US 2006/0200729 A1 Sep. 7, 2006

Related U.S. Application Data

(63) Continuation of application No. 10/753,534, filed on Jan. 9, 2004, now Pat. No. 7,051,260, which is a continuation of application No. 09/923,405, filed on Aug. 8, 2001, now Pat. No. 6,697,992.

(30) Foreign Application Priority Data

Aug. 14, 2000 (JP) ............................ 2000-245483

(51) Int. Cl.
*H03M 13/00* (2006.01)
(52) U.S. Cl. ...................... 714/754; 714/763
(58) Field of Classification Search ................ 714/752, 714/763, 754

See application file for complete search history.

(56) References Cited

U.S. PATENT DOCUMENTS

| 4,542,454 A | * | 9/1985 | Brcich et al. ................ 711/106 |
| 4,694,454 A | | 9/1987 | Matsuura |
| 4,758,992 A | | 7/1988 | Taguchi |
| 5,410,507 A | | 4/1995 | Tazunoki et al. |
| 5,623,451 A | * | 4/1997 | Kawagoe ..................... 365/222 |
| 5,629,898 A | | 5/1997 | Idei et al. |
| 5,761,143 A | * | 6/1998 | Fukuda ....................... 365/210 |
| 6,147,916 A | | 11/2000 | Ogura |
| 6,199,139 B1 | | 3/2001 | Katayama et al. |
| 6,446,159 B2 | | 9/2002 | Kai et al. |

FOREIGN PATENT DOCUMENTS

| JP | 3-023587 | 1/1991 |
| JP | 4-149899 | 5/1992 |
| JP | 7-262794 | 10/1995 |
| JP | 4-091206 | 4/1997 |
| JP | 10-177800 | 6/1998 |
| JP | 11-213659 | 8/1999 |
| JP | 2000-11688 | 1/2000 |

* cited by examiner

*Primary Examiner*—Shelly Chase
*Assistant Examiner*—Esaw T. Abraham
(74) *Attorney, Agent, or Firm*—Miles & Stockbridge P.C.

(57) ABSTRACT

When a DRAM enters an operation mode in which only a data storing operation is performed, a check bit for error detection and correction for plural data is generated and stored. Refresh operation is performed in a refresh cycle which is made long within an allowable range of an error occurrence by an error correcting operation using the check bit. Before the DRAM returns to the normal operation mode from the data holding operation mode, an error bit is corrected by using the data and the check bit.

4 Claims, 32 Drawing Sheets

FIG. 5

R IS RESERVED (INHIBIT)
X : 0 OR 1

... 256MbSDRAM
... 64MbSDRAM

| BA1 | BA0 | A12 | A11 | A10 | A9 | A8 | | |
|-----|-----|-----|-----|-----|----|----|---|---|
| X | A13 | A12 | A11 | A10 | A9 | A8 | | |
| | | OPCODE | | | | | | |
| 0 | 0 | 0 | 0 | 0 | 0 | 0 | BURST READ / BURST WRITE | ⎫ |
| 0 | 0 | 0 | 0 | X | 0 | 1 | | ⎪ WRITE |
| 0 | 0 | 0 | X | X | 1 | 0 | BURST READ / BURST WRITE | ⎬ MODE |
| 0 | 0 | 0 | X | X | 1 | 1 | R | ⎪ |
| 0 | 0 | 1 | X | X | 0 | 0 | SLEEP MODE | ⎭ |
| 0 | 1 | 0 | X | X | 0 | 0 | CELL-LEAK MONITOR MODE | ⎫ |
| 0 | 1 | 1 | X | X | 0 | 0 | R | ⎪ |
| 0 | 0 | 1 | X | X | 0 | 1 | ECC SYNDROME MODE | ⎬ SUPER LOW |
| 0 | 1 | 0 | X | X | 0 | 1 | ECC PARITY MODE | ⎪ POWER MODE |
| 0 | 1 | 1 | X | X | 0 | 1 | ECC CORRECT MODE | ⎭ |

FIG. 14

$$X \cdot G' = P$$

$$G = \begin{pmatrix} 11111111 & 00000000 & 00000000 & 00000000 & 00000000 & 00000000 & 00000000 & 10100101 \\ 10100101 & 11111111 & 00000000 & 00000000 & 00000000 & 00000000 & 00000000 & 11001001 \\ 11001001 & 10100101 & 11111111 & 00000000 & 00000000 & 00000000 & 00000000 & 01110011 \\ 01110011 & 11001001 & 10100101 & 11111111 & 00000000 & 00000000 & 00000000 & 00011101 \\ 00011101 & 01110011 & 11001001 & 10100101 & 11111111 & 00000000 & 00000000 & 00000010 \\ 00000010 & 00011101 & 01110011 & 11001001 & 10100101 & 11111111 & 00000000 & 00000000 \\ 00000000 & 00000010 & 00011101 & 01110011 & 11001001 & 10100101 & 11111111 & 00000000 \\ 00000000 & 00000000 & 00000010 & 00011101 & 01110011 & 11001001 & 10100101 & 11111111 \end{pmatrix}$$

EXAMPLE)
X=(00000001 00000010 00000100 00001000 00010000 00100000 01000000 10000000)
P=(10011001)

FIG. 15

$$Y \cdot H' = S$$

$$H = \begin{pmatrix} 11111111 & 00000000 & 00000000 & 00000000 & 00000000 & 00000000 & 00000000 & 10100101 & 10000000 \\ 10100101 & 11111111 & 00000000 & 00000000 & 00000000 & 00000000 & 00000000 & 11001001 & 01000000 \\ 11001001 & 10100101 & 11111111 & 00000000 & 00000000 & 00000000 & 00000000 & 01110011 & 00100000 \\ 01110011 & 11001001 & 10100101 & 11111111 & 00000000 & 00000000 & 00000000 & 00011101 & 00010000 \\ 00011101 & 01110011 & 11001001 & 10100101 & 11111111 & 00000000 & 00000000 & 00000010 & 00001000 \\ 00000010 & 00011101 & 01110011 & 11001001 & 10100101 & 11111111 & 00000000 & 00000000 & 00000100 \\ 00000000 & 00000010 & 00011101 & 01110011 & 11001001 & 10100101 & 11111111 & 00000000 & 00000010 \\ 00000000 & 00000000 & 00000010 & 00011101 & 01110011 & 11001001 & 10100101 & 11111111 & 00000001 \end{pmatrix}$$

INFORMATION BITS / CHECK BITS

EXAMPLE)
Y=(00000001 00000010 00000100 00001000 00010000 00100000 01000000 10000000 10011001)
S=(00000000)

FIG. 19   GENERATOR POLYNOMIAL   $G(x) = x^5 + x^4 + x^3 + x^2 + 1$

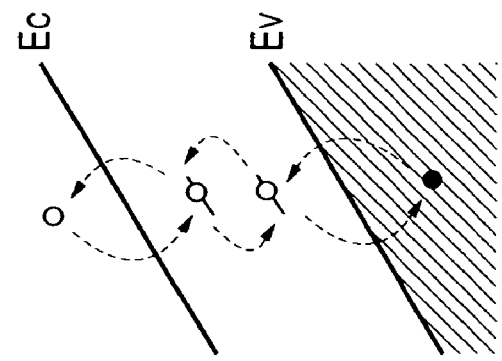
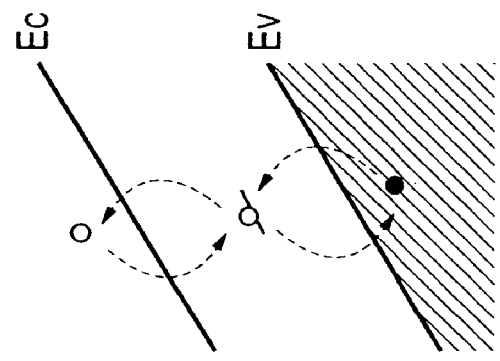
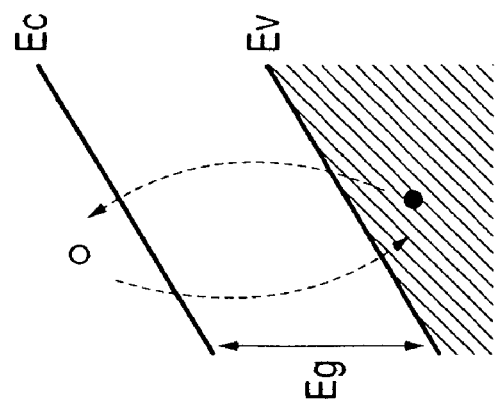
[CLASSIFICATION OF CARRIER GENERATING MECHANISMS]

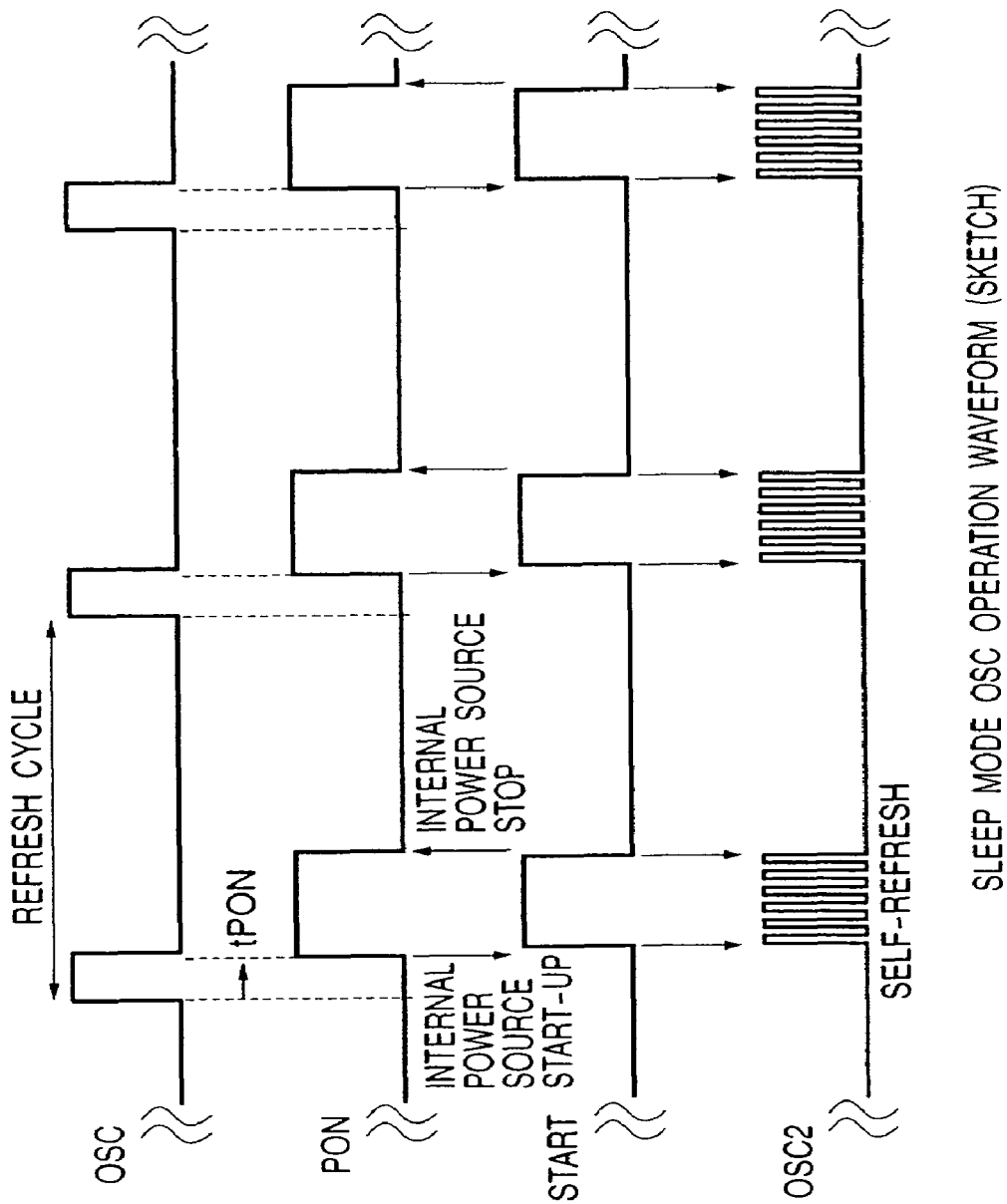

DATA STORING METHOD OF DYNAMIC RAM AND SEMICONDUCTOR MEMORY DEVICE

CROSS-REFERENCE TO RELATED APPLICATION

This application is a continuation of application Ser. No. 10/753,534 filed Jan. 9, 2004, now U.S. Pat. No. 7,051,260, which is a continuation of application Ser. No. 09/923,405 filed Aug. 8, 2001, now U.S. Pat. No. 6,697,992.

BACKGROUND

The present invention relates to a data storing method of a dynamic RAM (Random Access Memory) and a semiconductor memory device and, more particularly, to a technique effective for use in a data storing technique in a memory circuit having dynamic memory cells.

It was found by the search made after the present invention was achieved that Japanese Unexamined Patent Publication Nos. Hei 11(1999)-213659 (corresponding to U.S. Pat. No. 6,199,139, hereinbelow, called prior art 1) and Hei 7(1995)-262794 (hereinbelow, called prior art 2) seem to be related to the present invention to be described hereinlater. According to prior art 1, to optimize the refresh cycle interval of a DRAM in a sleep mode, the frequency of the refresh cycle is controlled by software under the control of a CPU by using the number of error rows detected by an error correction decoding circuit. According to prior art 2, an ECC circuit is provided in a DRAM, an error is detected, and corrected data is written in a memory cell. In the prior arts, there is no description suggesting that lower power consumption is realized with a simple configuration like the present invention as will be described hereinlater.

Japanese Unexamined Patent Publication No. Hei 11-213659 discloses a technique of optimizing the refresh interval of a memory circuit in a sleep mode by using an error correction coding circuit, an error correction decoding circuit, a refresh interval control circuit, a refresh executing circuit, and the like.

Japanese Unexamined Patent Publication No. 2000-11688 discloses a technique of realizing lower power consumption in a self refresh mode and increased manufacturing yield by the following method. When a dynamic RAM enters a self refresh mode, internal control signals EC and EW for a sense amplifier SA and an ECC circuit ECC go high, thereby making the ECC circuit ECC selectively operative. JP-A Hei 3(1991)-23587 discloses a technique of generating and writing a parity bit and making a parity check at the time of a refresh.

Japanese Unexamined Patent Publication No. Hei 10(1998)-177800 discloses an error correcting dynamic memory having an error correcting circuit for executing error correction during a refresh of a plurality of dynamic memory cells and omitting error correction on a first sequence of one or more cells out of the plurality of dynamic memory cells.

Japanese Unexamined Patent Publication No. Hei 9(1997)-91206 discloses a DRAM in which a read cycle for detecting an error is executed in each refresh cycle and, when an error exists, corrected data is rewritten as necessary.

Japanese Unexamined Patent Publication No. Hei 4(1992)-149899 discloses a technique of adding an ECC for each word line to check data during a refresh cycle even when there is no access in order to built a very reliable memory system.

Japanese Unexamined Patent Publication No. Hei 7(1995)-262794 discloses a technique of providing an error correcting circuit in a memory chip of a memory required to be data-refreshed, from/to which data can be always read/written, collating data for an error detection and correction code with data read from the memory in a refresh cycle and, when an error is detected, writing error-detected data into the memory.

SUMMARY OF THE INVENTION

In the techniques where error detection is performed and data obtained by correcting a detected error is written in a memory cell, the operation of a CPU for executing software, or the operation of the ECC circuit is necessary in the refresh period. In other words, the CPU or ECC circuit has to operate in order to extend the refresh cycle, and it causes a problem such that a reduced amount of currents in the refreshing operation may be canceled out by an increase in current consumption by the operation of the CPU or the ECC circuit.

An object of the invention is to provide a data storing method of a dynamic RAM and a semiconductor memory device with reduced current consumption. The above and other objects and novel features of the invention will become apparent from the following description of the specification and the appended drawings.

The outline of a representative one of inventions disclosed in the application will be briefly described as follows. When a DRAM enters an operation mode in which only a data storing operation is performed, a check bit for error detection and correction for plural data is generated and stored. Refresh operation is performed in a refresh cycle which is made long within an allowable range of an error occurrence by an error correcting operation using the check bit. Before the DRAM returns to the normal operation mode from the data holding operation mode, an error bit is corrected by using the data and the check bit.

The outline of another one of representative inventions disclosed in the application will be described as follows. A semiconductor integrated circuit device has: a memory circuit including a dynamic memory cell and having an information retaining mode during which data is not read/written from/to other circuits; and a data retention control circuit including an ECC circuit and a refresh cycle setting circuit. When the dynamic RAM enters an operation mode of performing only an operation of retaining data, for plural data, a check bit for error detection and correction is generated and stored by using the ECC circuit. The refresh cycle is extended by the refresh cycle setting circuit within a permissible range of error occurrence by an error correcting operation using the check bit. Before the DRAM returns from the information retaining mode to a normal operation mode, an error bit in data is corrected by using the data and the check bit by the ECC circuit.

BRIEF DESCRIPTION OF THE DRAWINGS

FIG. 5 is a truth table of an example of the DRAM to which the invention is applied.

FIG. 14 is a diagram showing a bit pattern as an example of a generator matrix of a (72, 64) code (correction Hamming code of one-bit correction and two-bit detection).

FIG. 15 is a diagram showing a bit pattern as an example of a test matrix of a (72, 64) code (correction Hamming code of one-bit correction and two-bit detection).

FIGS. 33A, 33B, and 33C are schematic diagrams of a carrier generating mechanism.

FIG. 34 is an operation waveform chart of a basic OSC of an example of a cell leak monitoring method according to the invention.

DETAILED DESCRIPTION

Figure 1:
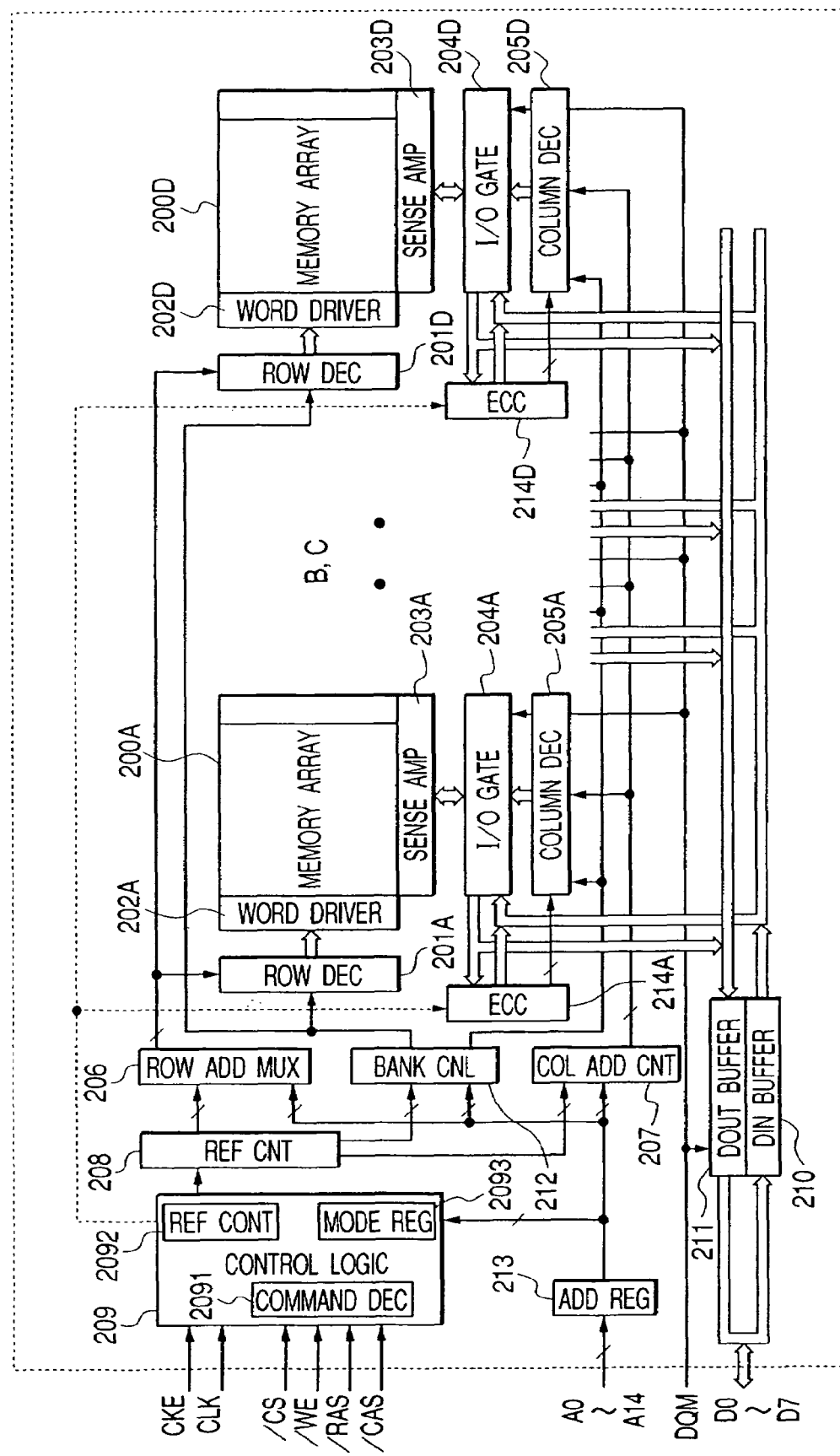
FIG. 1 is a general block diagram showing an example of a DRAM according to the invention.

FIG. 1 is a general block diagram showing an example of a dynamic RAM (hereinbelow, simply called DRAM) according to the invention. The DRAM of the example is directed to an SDRAM (Synchronous Dynamic Random Access Memory). The SDRAM of the example has, but not limited, four memory arrays 200A to 200D in correspondence with four memory banks. The diagram illustrates two memory arrays 200A and 200D out of the four memory arrays 200A to 200D. Each of the memory arrays 200A to 200D corresponding to the four memory banks 0 to 3 has dynamic memory cells arranged in a matrix. A terminal for selecting memory cells arranged in the vertical direction of the memory array in the diagram is coupled to a word line (not shown), and data input/output terminals of memory cells arranged in the lateral direction are coupled to complementary data lines (not shown) every row.

One of the not-shown word lines of the memory array 200A is driven to a selection level in accordance with a decoding result of a row address signal by a row decoder 201A. The row decoder 201A includes a word driver for driving one of word lines to the selection level in accordance with a decoding result. The not-illustrated complementary data lines in the memory array 200A are coupled to input/output lines (IO lines) via a sense amplifier 203A, an IO gate 204A as a column selection circuit, and a column decoder 205A. The IO gate includes a main amplifier and a write amplifier.

A sense amplifier 202A is an amplifier for detecting and amplifying a very small potential difference appearing on each complementary data line when data is read from a memory cell. The I/O gate 204A includes a switch MOSSFET for selecting one of the complementary data line so as to be coupled to a complementary I/O line. The column switch MOSFET performs a selecting operation in accordance with a result of decoding a column address signal by the column decoder 205A.

The not-illustrated memory arrays 200B and 200C are also similarly provided with row decoders 201B and 201C, sense amplifiers 203B and 203C, I/O gates 203B and 203C, and column decoders 205B and 205C, respectively. The I/O line is shared by the memory banks and is connected to the output terminal of a data input circuit (DIN buffer) 210 and an input terminal of a data output circuit (DOUT buffer) 211. Terminals D0 to D7 are, although not limited, data input/output terminals for inputting or outputting data D0 to D7 of eight bits.

Address signals A0 to A14 supplied from an address input terminal are held once in an address register 213. Out of time-sequentially entered address signals, a row address signal for selecting a memory cell is supplied to the row decoders 201A to 201D of the memory banks via a row address multiplexer 206. As the address signals for selecting the memory bank, A13 and A14 are designated and supplied to a bank control circuit 212 where selection signals for the four memory banks are generated. A column address signal is held in a column address counter 207. A refresh counter 208 generates a row address in an automatic refresh mode and a row address and a column address in a self refresh mode.

For example, in the case where the DRAM has a storage capacity of 256 bits, as a column address signal, address signals from A0 to A10 are valid in the ×8 configuration. The column address signals which are time-sequentially input are supplied as preset data to the column address counter 208. In a burst mode designated by a command to be described hereinlater, the column address signal as the preset data or a value obtained by sequentially incrementing the column address signal is output toward the column decoders 205A to 205D of the memory banks.

A control logic 209 has a command decoder 2091, a refresh controller 2092, a mode register 2093. The mode register 2093 holds various operation mode information. Only one of the row decoders 201A to 201D, which corresponds to the bank designated by the bank control circuit 212 operates and is allowed to perform a word line selecting operation.

To the control logic 209, although not limited, external control signals such as a clock signal CLK, a clock enable signal CKE, a chip select signal /CS (the "/" designation indicates that the signal is active low), a column address strobe signal /CAS, a row address strobe signal /RAS, and a write enable signal /WE, DQM, and an address signal sent via the mode register 2093 are supplied. The control logic 209 generates an internal timing signal for controlling an operation mode of the SDRAM and the operation of the circuit block on the basis of a change in level, timing, and so on of the signals. The control logic 209 has an input buffer corresponding to each of the signals.

The other external input signals are made significant synchronously with the rising edge of the internal clock signal. The chip select signal /CS instructs to start a command input cycle by its low level. When the chip select signal /CS is at the high level (chip not-selected state), the other inputs are not significant. However, the memory bank selecting state which will be described hereinlater and the internal operation of a burst operation are not influenced by a change to the chip non-selection state. Each of the signals /RAS, /CAS, and /WE has a function different from that of a corresponding signal in a regular DRAM but becomes significant when a command cycle to be described hereinlater is defined.

The clock enable signal CKE is a signal instructing validity of the following clock signal. When the signal CKE is at the high level, the rising edge of the following clock signal CLK is valid. When the signal CKE is at the low level, the rising edge of the following clock signal CLK is invalid. In a read mode, when an external control signal /OE of performing an output enable control on the data output circuit 211 is provided, the signal /OE is also supplied to the control logic 209. When the signal /OE is, for example, at the high level, the data output circuit 211 enters a high output impedance state.

The row address signal is defined by the level in the row address strobe and bank active command cycle to be described hereinlater, which is synchronized with the rising edge of the clock signal CLK (internal clock signal).

The address signals A13 and A14 are regarded as bank selection signals in the row address strobe and bank active command cycle. Specifically, by the combination of the signals A13 and A14, one of the four memory banks 0 to 3 is selected. The memory bank selecting control is performed by a process of, but not limited, activating only the row decoder on the selected memory bank side, selecting none of column switching circuits on the side of not-selected memory banks, connecting only the selected memory bank to the data input circuit 210 and the data output circuit 211, and so on.

In the SDRAM, while a burst operation is performed in one memory bank, when another memory bank is designated and the row address strobe and bank active command is supplied, without exerting any influence on the operation in one of the memory banks executing the burst operation, the operation related to a row address in the another memory bank can be performed. Therefore, as long as the data D0 to D7 do not collide with each other at a data input/output terminal of, for example, 8 bits, during a command execution in which the process is not finished, a precharge command and a row address strobe and bank active command to the memory bank different from the memory bank on which the command is being executed can be issued to start an internal operation without waiting for the end of execution of the command.

Although not shown, an internal power source generating circuit is provided, which receives operation voltages such as VCC and VSS supplied from a power source terminal and generates various internal voltages such as an internal boosted voltage VPP corresponding to the selection level of a word line, an internal step-down voltage VDL corresponding to an operation voltage of the sense amplifier, and an internal step-down voltage VPERI corresponding to an operation voltage of a peripheral circuit and, in addition, although not shown, a memory cell plate voltage, a precharge voltage such as VDL/2, and a substrate back-bias voltage VBB.

In the embodiment, as a DRAM on-chip ECC, a cyclic code is used. Though only in the self refresh mode, reduced standby current by correcting (masking) a refresh error is realized. Specifically, ECC circuits (codecs) 214A to 214D are provided in correspondence with the memory banks 0 to 3, respectively. In the embodiment, when the ECC circuit uses a cyclic code, the circuit scale of a coder/decoder (codec) as the ECC becomes smaller. Thus, a longer code length and the reduced parity bits can be achieved, and a disadvantage related to the area by the DRAM onchip ECC can be minimized.

In the embodiment, a plurality of cycles are necessary for generating a parity bit and correcting an error bit. The application range is therefore limited to a case where high access speed is not required such as a case where the SDRAM enters the self refresh mode for a data retention mode and a case where the SDRAM returns from the self refresh mode to a normal mode. Because of such limitation on the operation of the ECC, the power consumption can be largely reduced.

By the ECC circuits 214A to 214D, a refresh pause error bit can be corrected, and the ECC circuits do not operate in the self refresh in a data retention mode. Therefore, even when an error bit occurs, it is left without being corrected in the self refresh period in the data retention mode.

In the example of applying the invention to the SDRAM (having the ×8 configuration) of 256 Mbits, although not limited, the ECC circuits 214A to 214D process 16 bits per time in accordance with a column access, output 16 parity bits each time (finally) at the time of coding, and sequentially output corrected data of 16 bits and an error position (column address of 10 bits) at the time of decoding. In the case of the ×8 configuration as described above, although the I/O width seems to be eight bits, it is designed so as to be commonly used by the ×4, ×8, and ×16 configurations, so that the I/O width can be therefore enlarged to 16 bits. In the case of the 16-bit width, the column address has a nine-bit width. For an access to a parity area, the column address is internally increased to 10 bits.

The operation procedure of the ECC circuits 214A to 214D is as follows.

① Before a refresh operation for the data retention mode, parity bits are calculated and written for all the codes (all bits) by the ECC circuits 214A to 214D. A code is constructed by bits in the Y direction (on the same word line), and a parity bit is calculated and written while performing a paging operation. For example, a BCH code of 2048 bits (information bits) and 32 bits (parity bits) is generated.

② A self refresh is executed in accordance with an OSC cycle. The refresh cycle is extended in the range of collectability. When the refresh cycle extended in the ECC correctable range is set, naturally, an error bit occurs in tail bits. In the data retention mode, an operation similar to the conventional self refresh is performed. That is, processes such as an error correcting process by the ECC circuit are not performed. The error correcting process by the ECC circuit may be periodically performed in predetermined cycles during the self refresh period. It is also possible to provide a temperature change detecting circuit for detecting whether a temperature change of the DRAM exceeds a predetermined value or not, and execute the error correcting process during the self refresh period in response to an instruction of the circuit. The self refresh cycle is initially set on the basis of refresh cycle information pre-stored in a memory circuit in a non-volatile manner.

③ A process of correcting an error bit is performed before returning to the normal operation mode. Specifically, the ECC circuit is made active to calculate corrected data and an error position with respect to all the codes (all the bits) while performing the paging operation and to write the corrected data of the error bit. Such operations ① to ③ are, different from those in the standard of a conventional self refresh mode, self refresh in a new mode (data retention mode) of a long period extended on the precondition that the error correcting process by the ECC circuit is performed. The long period may be adjusted (changed) by a refresh cycle changing circuit by a cell leak monitor or the like.

Figure 2:
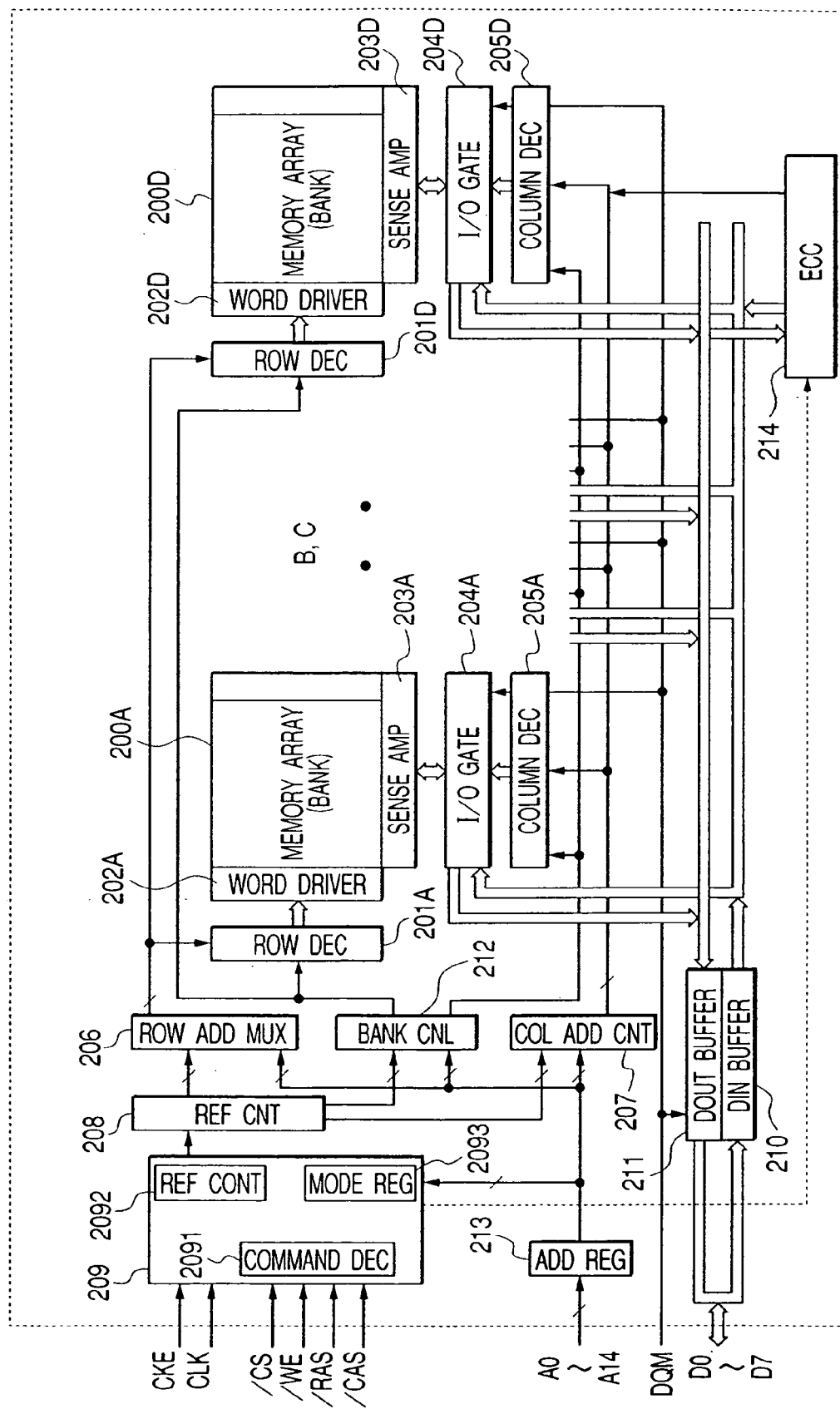
FIG. 2 is a general block diagram showing another example of the DRAM according to the invention.

FIG. 2 is a general block diagram of another example of the DRAM according to the invention. In the DRAM of the example, only one ECC circuit is provided in the DRAM chip. That is, the ECC circuit is commonly used by the four memory banks. Although the operations of calculating and correcting a parity bit are performed by the control logic in the example of FIG. 1, they are performed by the user in this case.

The operating procedure by the ECC circuit 214 of the example is as follows. ① Before entering the self refresh mode for the data retention mode, the SDRAM enters a parity bit calculating mode (new mode). Specifically, the ECC circuit 214 is made active to enable the parity bit calculation and the writing operation for all the codes to be executed by the paging operation.

② The SDRAM enters the self refresh mode. In the self refresh ②, the OSC cycle is extended in the range of the correctability of the ECC circuit 214. In a manner similar to the foregoing example, naturally, an error bit occurs in tail bits. In the data retention mode, an operation similar to the conventional self refresh is carried out. That is, processes such as the error correcting process by the ECC circuit 214 are not performed.

③ Before the self refresh mode is canceled and the SDRAM returns to a normal operation, the SDRAM enters the data correcting mode (new mode). To be specific, the ECC circuit 214 is made active to execute calculation of corrected data and error position (column address) and the correcting and writing operation of the corrected data for all the codes.

Figure 3:
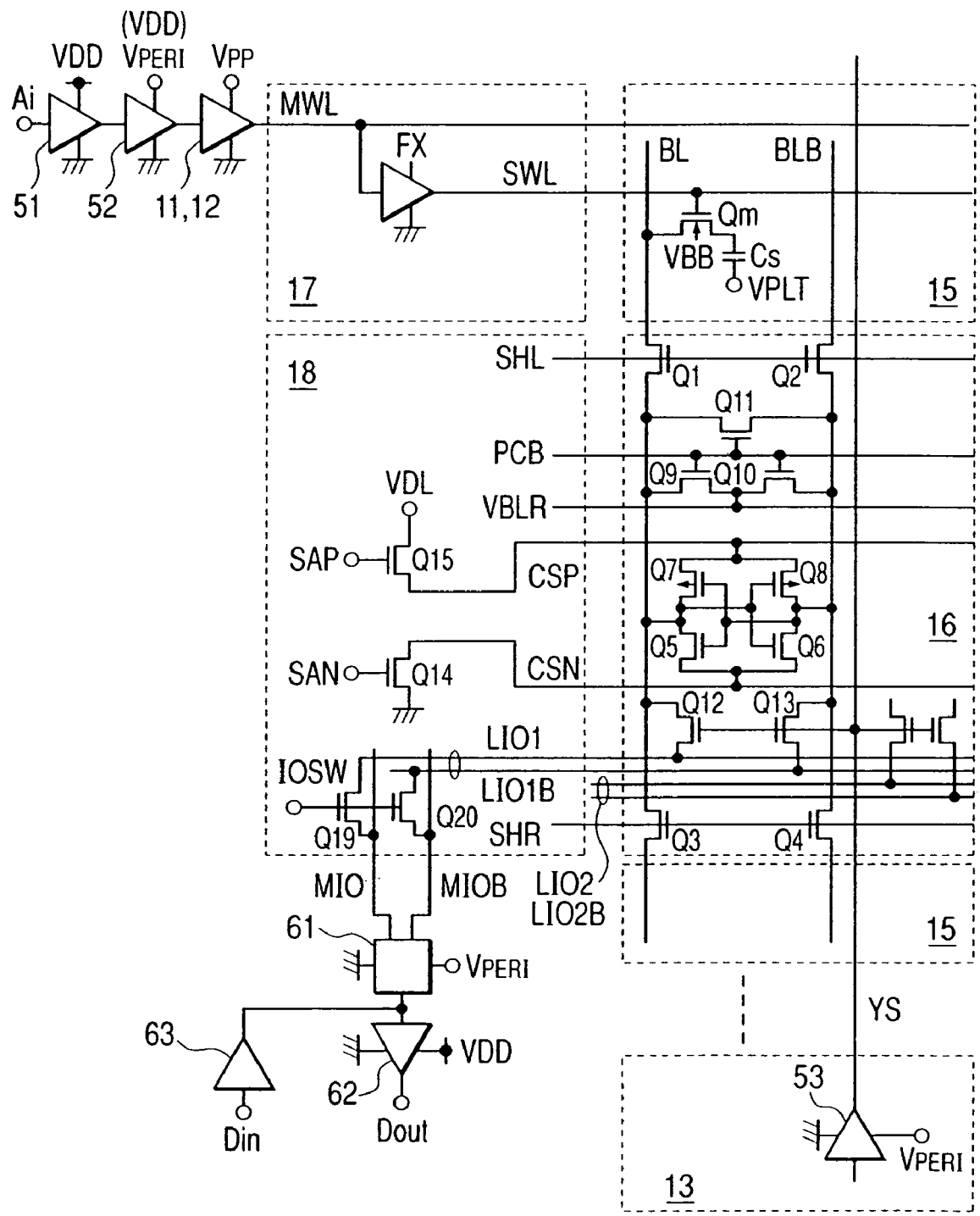
FIG. 3 is a circuit diagram showing an example of the DRAM according to the invention.

FIG. 3 is a circuit diagram showing an example of a DRAM according to the invention. FIG. 3 illustrates a simplified circuit diagram of processes from address input till data output, mainly showing a sense amplifier portion. The example is directed to what is called a two-intersection architecture in which a pair of complementary bit lines are folded and extend in parallel with each other by using the sense amplifier as a center. In the drawing, a hierarchical structure such that word lines are constructed by a main word line MWL and a subword line SWL, and input/output lines are constructed by a local input/output line LIO and a main input/output line MIO. Circuits provided for a sense amplifier 16 and a cross area 18 sandwiched by two subarrays 15 are illustrated and the others are shown as blocks.

In the application, it is understood that the term "MOS" inherently stands for a metal oxide semiconductor. The MOS generally called in recent years includes a configuration in which a metal in the substantial portion of a semiconductor device is replaced by a non-metal electric conductor such as polysilicon or a configuration in which oxide is replaced by another insulating material. It comes to be understood that CMOS has also wider technical meaning according to a change in the definition of the MOS. MOSFET is also understood, not in a narrow sense but, in a broader sense, for example, to be substantially regarded as an insulating gate field effect transistor. In the invention, the CMOS, MOSFET, and so on in a broader sense as described above are adopted.

A dynamic memory cell positioned between the subword line SWL provided for the memory mat 15 and one (BL) of the complementary bit lines BL and BLB is illustrated as a representative. The dynamic memory cell has an address selection MOSFET Qm and a storage capacitor Cs. The gate of the address selection MOSFET Qm is connected to the subword line SWL, the drain of the MOSFET Qm is connected to the bit line BL, and the storage capacitor Cs is connected to the source. The other electrode of the storing capacitor Cs is commonly used and a plate voltage VPLT is applied to the electrode. A negative back bias voltage VBB is applied to the substrate (channel) of the MOSFET Qm. Although not limited, the back bias voltage VBB is set to a voltage like −1V. The selection level of the subword line SWL is set to a high voltage VPP higher than the high level of the bit line only by the amount of a threshold voltage of the address selection MOSFET Qm.

When the sense amplifier is operated with an internal step-down voltage VDL, a high level amplified by the sense amplifier and given to a bit line is set to the internal voltage VDL level. The high voltage VPP corresponding to the selection level of the word line is equal to a sum of VDL+Vth+α. The pair of complementary bit lines BL and BLB of the subarray provided on the left side of the sense amplifier are disposed parallel to each other as shown in FIG. 3. The complementary bit lines BL and BLB are connected to input/output nodes of a unit circuit of the sense amplifier by shared switch MOSFETs Q1 and Q2, respectively.

The unit circuit of the sense amplifier takes the form of a CMOS latch circuit having N-channel type amplification MOSFETs Q5 and Q6 and P-channel type amplification MOSFETs Q7 and Q8 having gates and drains connected so as to cross with each other in a latch form. The sources of the N-channel type MOSFETs Q5 and Q6 are connected to a common source line CSN. The sources of the P-channel type MOSFETs Q7 and Q8 are connected to a common source line CSP. A power switch MOSFET is connected to each of the common source lines CSN and CSP.

Although not limited, to the common source line CSN to which the sources of the N-channel type amplification MOSFETs Q5 and Q6 are connected, an operation voltage corresponding to the ground potential is applied by an N-channel type power switch MOSFET Q14 provided in the cross area 18. Similarly, the common source line CSP to which the sources of the P-channel type amplification MOSFETs Q7 and Q8 are connected is provided with an N-channel type power MOSFET Q15 for supplying the internal voltage VDL. The power switch MOSFETs may be provided so as to be distributed to unit circuits.

Sense amplifier activate signals SAN and SAP to be supplied to the gates of the N-channel type power MOSFETs Q14 and Q15 are signals of the same phase which are set to the high level when the sense amplifier is made active. The high level of the signal SAP is equal to the boosted voltage VPP level. The boosted voltage VPP is about 3.6V when VDL is 1.8V. Consequently, after setting the N-channel type MOSFET Q15 in an ON state, the common source line CSP can be set to the internal voltage VDL level.

At an input/output node of the unit circuit of the sense amplifier, a precharge (equalize) circuit constructed by an equalize MOSFET Q11 for short-circuiting the complementary bit lines and switch MOSFETs Q9 and Q10 for supplying the half precharge voltage VBLR to a complementary bit line is provided. A precharge signal PCB is supplied commonly to the gates of the MOSFETs Q9 to Q11. A driver circuit for generating the precharge signal PCB has an inverter circuit (not shown) in the cross area to make the rising and fall edges occur at high speed. More specifically, when a memory access is started, prior to a word line selecting timing, the MOSFETs Q9 to Q11 constructing the precharge circuit are switched at high speed through the inverter circuits provided so as to be distributed to the cross areas.

In the cross area 18, an IO switch circuit IOSW (constructed by switch MOSFETs Q19 and Q20 for connecting the local input/output lines LIO and the main input/output lines MIO) is disposed. Further, a half precharge circuit of the common source lines CSP and CSN of the sense amplifier, a half precharge circuit of the local input/output lines LIO, a VDL precharge circuit of the main input/output lines, a distributed driver circuit of shared selection signal lines SHR and SHL, and the like are also provided.

The unit circuit of the sense amplifier is connected via shared switch MOSFETs Q3 and Q4 to the similar complementary bit lines BL and BLB in the subarray 15 on the lower side of the drawing. For example, when the subword line SWL in the upper subarray is selected, the upper shared switch MOSFETs Q1 and Q2 in the sense amplifier are turned on and the lower shared switch MOSFETs Q3 and Q4 are turned off. Switch MOSFETs Q12 and Q13 construct a column (Y) switch circuit. When the selection signal YS is set to the selection level (high level), the column switch circuit is turned on to thereby connect the input/output nodes of the unit circuit of the sense amplifier with local input/output lines LIO1, LIO1B, LIO2, LIO2B, and so on.

The input/output nodes of the sense amplifier are connected to the complementary bit lines BL and BLB on the upper side, a weak signal of a memory cell connected to the selected subword line SWL is amplified, and the amplified signal is transmitted to the local input/output lines LIO1 and LIO1B via the column switch circuit (Q12 and Q13). The local input/output lines LIO1 and LIO1B extend along the sense amplifier column, that is, in the lateral direction of the drawing. The local input/output lines LIO1 and LIO1B are connected to the main input/output lines MIO and MIOB to which input terminals of a main amplifier 61 are connected, via the IO switch circuit constructed by the N-channel type MOSFETs Q19 and Q20 provided in the cross area 18.

The IO switch circuit is switched by a selection signal obtained by decoding an X address signal. The IO switch circuit may have a CMOS switch configuration in which a P-channel type MOSFET is connected in parallel with each of the N-channel type MOSFETs Q19 and Q20. In a burst mode of the synchronous DRAM, the column selection signal YS is switched by a counter operation, and the connection between the local input/output lines LIO1 and LIO1B and LIO2 and LIO2B and two pairs of complementary bit lines BL and BLB of the subarray is sequentially switched.

An address signal Ai is supplied to an address buffer 51. The address buffer 51 operates in a time sharing manner to capture an X address signal and a Y address signal. The X address signal is supplied to a predecoder 52, and a signal for selecting the main word line MWL is generated via a main row decoder 11 and a main word driver 12. The address buffer 51 receives the address signal Ai supplied from an external terminal, and is operated by the source voltage VDD (or VCC) supplied from the external terminal. The predecoder 52 is operated by the step-down voltage VPERI obtained by dropping the source voltage VDD, and the main word driver 12 is operated by the boosted voltage VPP. As the main word driver 12, a logical circuit with a level shifting function, which receives the predecode signal is used. A column decoder (driver) 53 includes a driving circuit for generating an operation voltage by a MOSFET Q23 as a component of the VCLP generating circuit, receives the Y address supplied by the time-sharing operation of the address buffer 51, and generates the selection signal YS.

The main amplifier 61 is operated by the step-down voltage VPERI and outputs an amplified signal from an external terminal Dout via an output buffer 62 operated by the source voltage VDD supplied from an external terminal. A write signal input from an external terminal Din is captured via an input buffer 63 and is supplied to the main input/output lines MIO and MIOB via a write amplifier (write driver) included in the main amplifier 61 in the diagram. In an input portion of the output buffer 62, a level shifter and a logical unit for outputting an output signal of the level shifter synchronously with a timing signal corresponding to the clock signal are provided.

Although not limited, the source voltage VDD supplied from the external is set to 3.3V, the step-down voltage VPERI supplied to an internal circuit is set to 2.5V, and the operation voltage VDL of the sense amplifier is set to 1.8V. The word line selection signal (boosted voltage) is set to 3.6V. The bit line precharge voltage VBLR is set to 0.9V corresponding to VDL/2, and the plate voltage VPLT is also set to 0.9V. The substrate voltage VBB is set to −1.0V. The source voltage VDD supplied from the external terminal may be set to a low voltage such as 2.5V. When the source voltage VDD is low, each of the step-down voltages VPERI and VDL may be similarly set to about 1.8V.

Alternatively, the source voltage VDD supplied from the external terminal is set to 3.3V, and each of the step-down voltage VPERI supplied to the internal circuit and the sense amplifier operation voltage VDL may be set to 2.0V or 1.8V. In such a manner, the internal voltages can be varied with respect to the external source voltage VDD.

Figure 4:
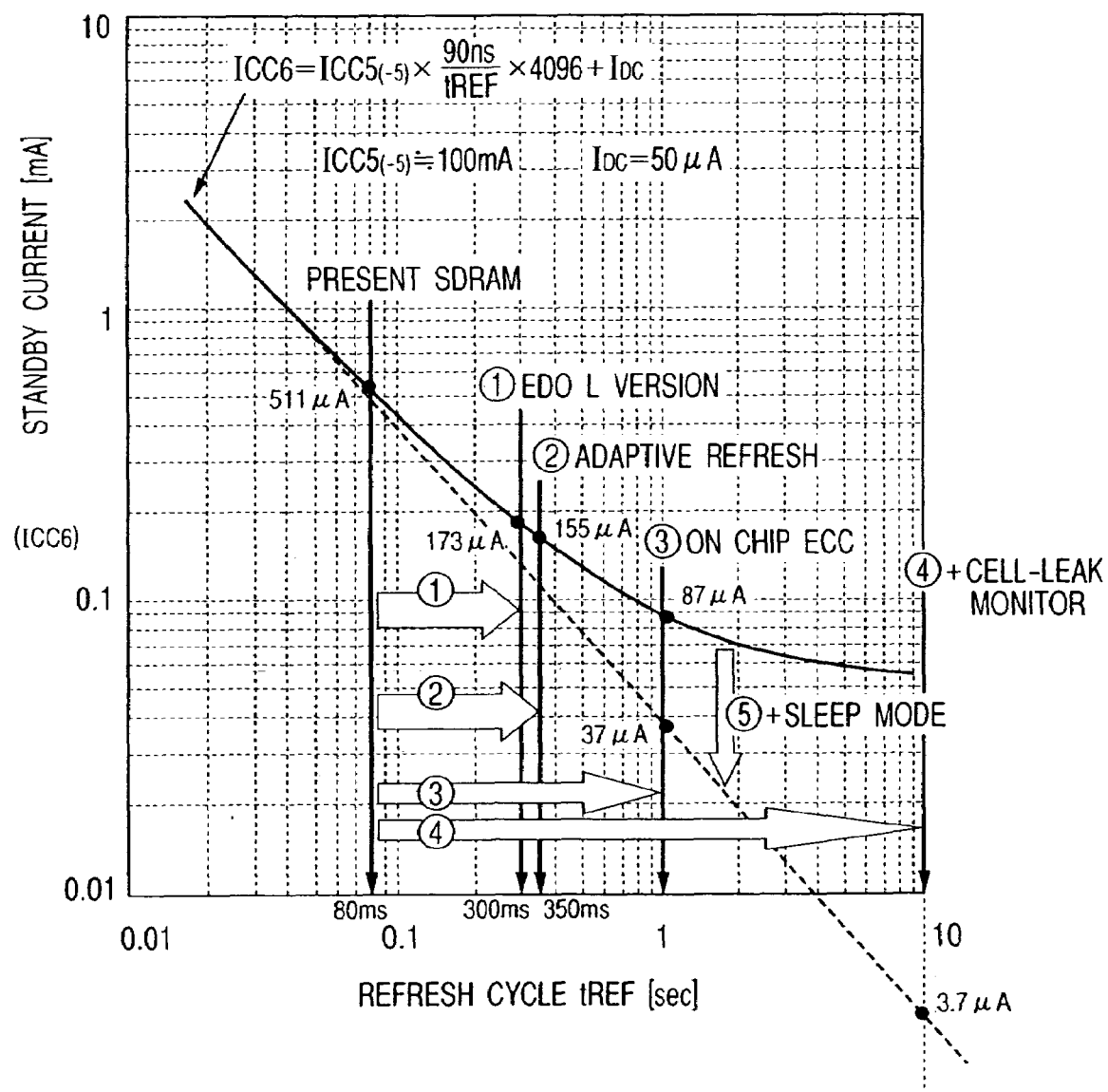
FIG. 4 is a characteristic diagram for explaining the relation between a refresh cycle of a DRAM and a standby current.

FIG. 4 is a characteristic diagram for explaining the relation between the refresh cycle of the DRAM and the standby current. The refresh cycle of the SDRAM under present conditions is about 80 ms in accordance with a data retaining characteristic of a trail bit. The current consumption in the refresh operation in such a cycle is about 511 µA (1 mA in the standard) which is relatively high. On the other hand, an error in the trail bit can be covered by the correctability of the ECC circuit by the application of the invention. Consequently, the refresh cycle can be made long like about 1 second or longer in accordance with the data retaining capability of other memory cells ignoring the error. Moreover, since the ECC circuit does not operate in the self refresh period, the current consumption can be largely reduced to about 87 µA (100 µA in the standard).

The refresh cycle of about 1 second includes a margin of the worst case of the data retention time at high temperature. Generally, the data retention time of a memory cell at room temperature is longer than that at high temperature by about 10 seconds. By performing temperature control as described hereinbelow with high accuracy, a super low power mode in which the refresh cycle can be increased by about 10 seconds can be realized.

The invention will be more concretely described hereinbelow. The concrete configuration and the operation of the ECC circuit will be described. The configuration of a long cycle OSC, an example of improving desired temperature dependency by combining the ECC circuit, and a case of combining a sleep mode (in which the internal power source is stopped) to further reduce the standby current will be described.

In a DRAM to which the invention is applied, a new command to improve the usability of the DRAM is added. Specifically, as shown in the truth table of FIG. 5, in an SDRAM of 256 Mbits, address signals A8 to A12, BA0 and BA1 are used. In an SDRAM of 64 Mbits, address signals A8 to A13 are used. In addition to the write mode as in the conventional SDRAM, a super low-power mode is used.

An added operation code (OPCODE #10) relates to the sleep mode in which the internal power source that determines the standby current is stopped. At this time, the standby current reaches about 2 µA. The stop/start of the sleep mode will be described hereinlater with reference to FIGS. 35 and 36. In the sleep mode, the basic OSC (oscillator) is also switched to a cell leak monitor to be described hereinlater with reference to FIG. 32. The "#" designation indicates that the numeral is hexadecimal.

The added operation code (OPCODE #20) relates to the cell-leak monitor mode in which the basic OSC (OSC used in the self refresh mode) is switched to a cell leak monitor. A similar operation is performed in the sleep mode.

Figure 19:
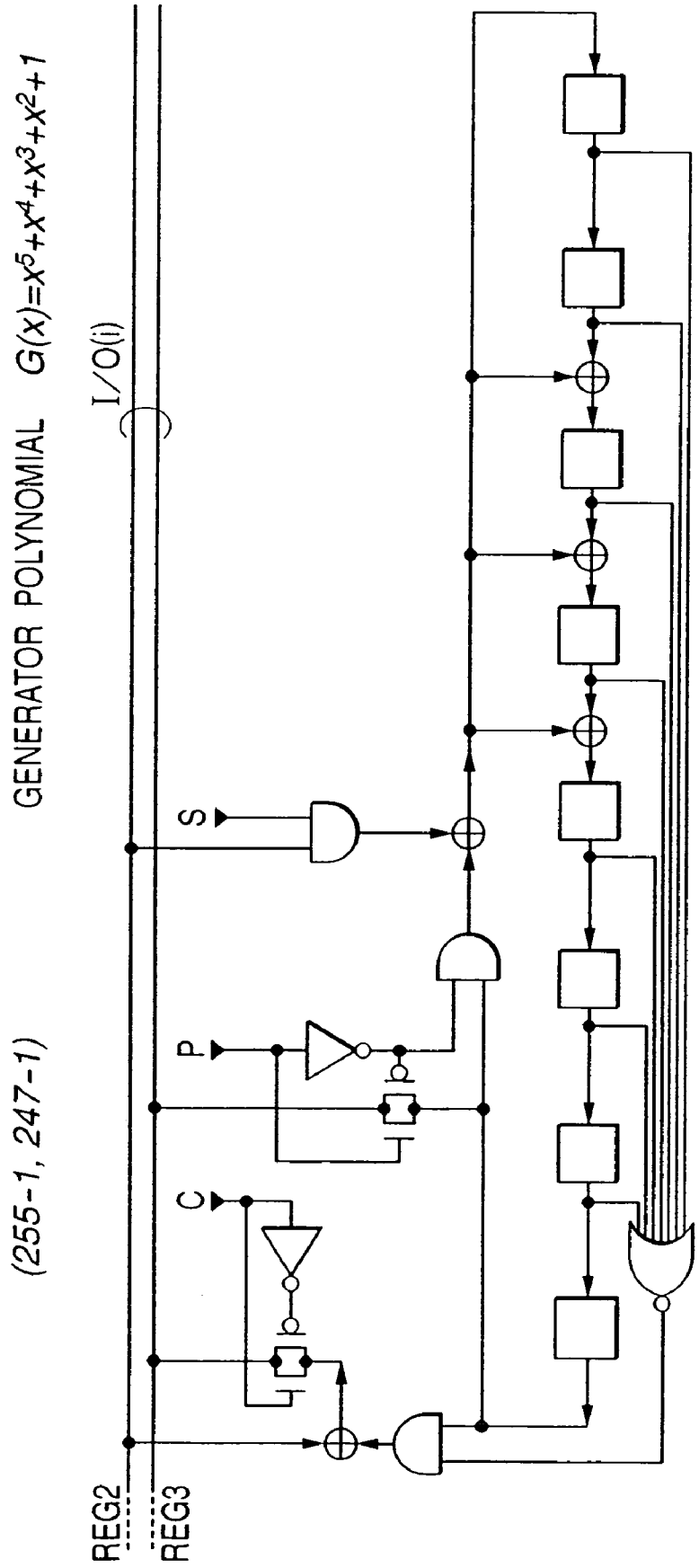
FIG. 19 is a schematic circuit diagram showing an example of an ECC circuit (codec) of a cyclic Hamming code having a length of 255 bits used for the invention.

The added operation code (OPCODE #11) relates to an ECC syndrome mode in which the ECC circuit is activated. Data read by a read command and sent to an I/O is mechanically captured and subjected to syndrome calculation. Concretely, in the example of the ECC circuit as shown in FIG. 19, a signal S goes high (H level), data is captured by a read command, and cyclic shifting of a shift register is performed. When 64 information bits are sequentially captured, eight parity bits remain in the shift register and a code having a length of 72 bits is resulted. When 64 information bits and eight parity bits are sequentially captured, syndrome calculation (pre-process of decoding) of a code having 72 bit length is made.

The added operation code (OPCODE #21) relates to an ECC parity mode in which the ECC circuit is activated. In response to a write command, the contents of the shift register are sequentially output to the I/O bus and written to a designated address. At this time, masking with a data mask signal DQM is required. When masking with the data mask signal DQM is not made, the command is recognized as a normal write command, and data is captured from the I/O buffer (DQ pin) and written to the designated address. The data mask signal is used to write a parity bit (check bit) into a memory cell after parity calculation by the operation code (OPCODE #11).

Concretely, for example, a signal P of the ECC circuit of FIG. 19 goes high (H level) and only cyclic shift of the shift register is performed in response to the write command. Since the signal S is at the L (low) level in this case, "0" is sent to the shift register, and the data in the shift register is sequentially output bit by bit to the I/O bus.

The added operation code (OPCODE #31) relates to an ECC correct mode in which the ECC circuit is activated. According to a syndrome pattern resulted in the shift register, read data is corrected one by one after the syndrome calculation by the OPCODE #11. Concretely, for example, a signal C of the ECC circuit of FIG. 19 goes high (H level). By the read command, a process of correcting data of the I/O bus on the basis of the remained values in the shift register, and the cyclic shift of the shift register are mechanically executed. When there is an error, inverted data is output to the I/O buss. When there is no error, the data is output as it is. After that, by executing the write command, the corrected data is written in the designated address. In this case, in a manner similar to the ECC parity mode, masking with the data mask signal DQM is necessary. When the masking with the signal DQM is not made, the command is recognized as a normal write command.

When self refresh is made in the cell leak monitor mode, refresh can be executed in a long cycle of 10 seconds or longer in practical use. That is, by the cell leak monitor which will be described hereinlater, data retention time of a memory cell can be monitored in high response to a change in chip temperature. As a result, the sufficient margin on the assumption of the worst case becomes unnecessary. In the sleep mode under general operating environments, a self refresh can be executed in a long cycle of about 10 seconds or longer. By stopping the operation of the internal circuit, a DC current (IDC) as shown in the characteristic diagram of FIG. 4 is also reduced in association with the increase in the refresh cycle.

As a result, as shown by the dotted line of consumption current ICC6 (standby current) in the characteristic diagram of FIG. 4, the refresh cycle dependency is eliminated by masking the tail bits by the ECC circuit and reducing the DC in the sleep mode by using both the long cycle OSC by the cell leak monitor and the long cycle in the cell-leak monitor, so that a super low power such as 10 µA (3.7 µA in the drawing) can be achieved. Such a super low power is comparable to a low-power SRAM (static RAM).

Figure 6:
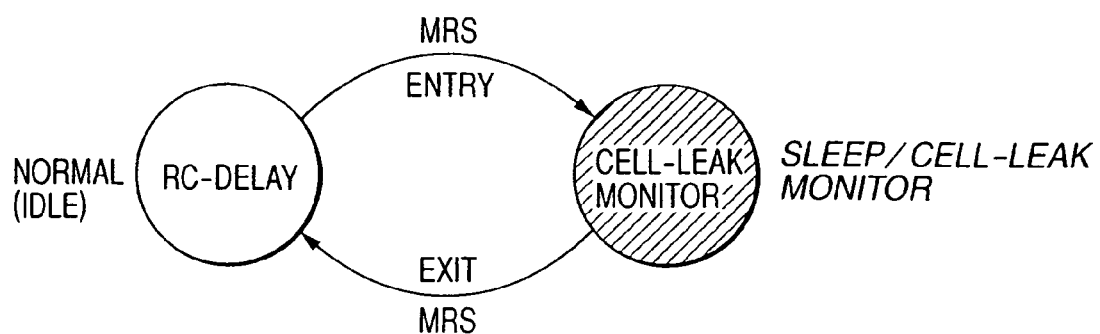
FIG. 6 is a state transition diagram of a basic OSC of an example of the DRAM according to the invention.

FIG. 6 is a state transition diagram of the basic OSC. In a normal mode, a relatively short refresh cycle is set by an oscillator by a delay circuit using an RC time constant (RC-Delay). In a sleep mode (cell-leak monitor mode), a relatively long refresh cycle is set by using the cell leak monitor.

Figure 7:
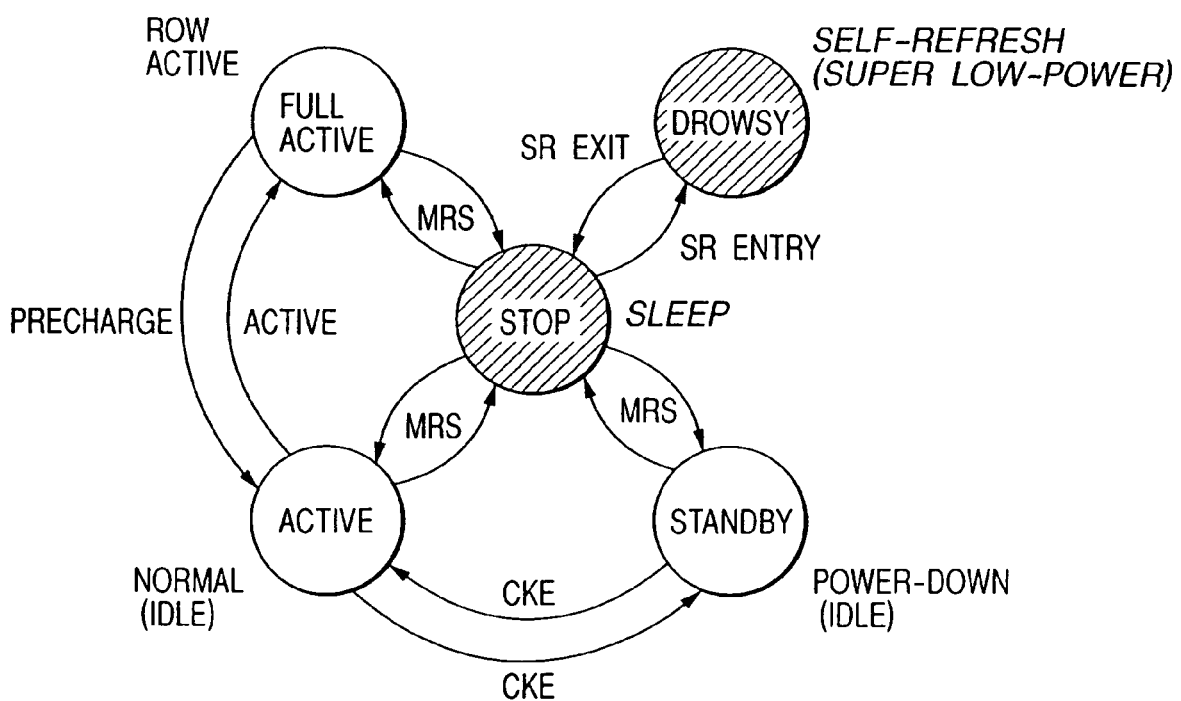
FIG. 7 is a state transition diagram of internal power sources of an example of the DRAM according to the invention.

FIG. 7 is a state transition diagram of an internal power source. In FIG. 7, the supply capability of the internal power source is controlled in three levels of "full active", "active", and "standby". "Drowsy" is a state where the power is on (the internal power circuit operates) only when a refresh operation is performed by the basic OSC of FIG. 6. "Stop" indicates a state where the power source is completely stopped except for a power source which cannot be stopped. These things will be described hereinlater with reference to FIG. 34.

Figure 8:
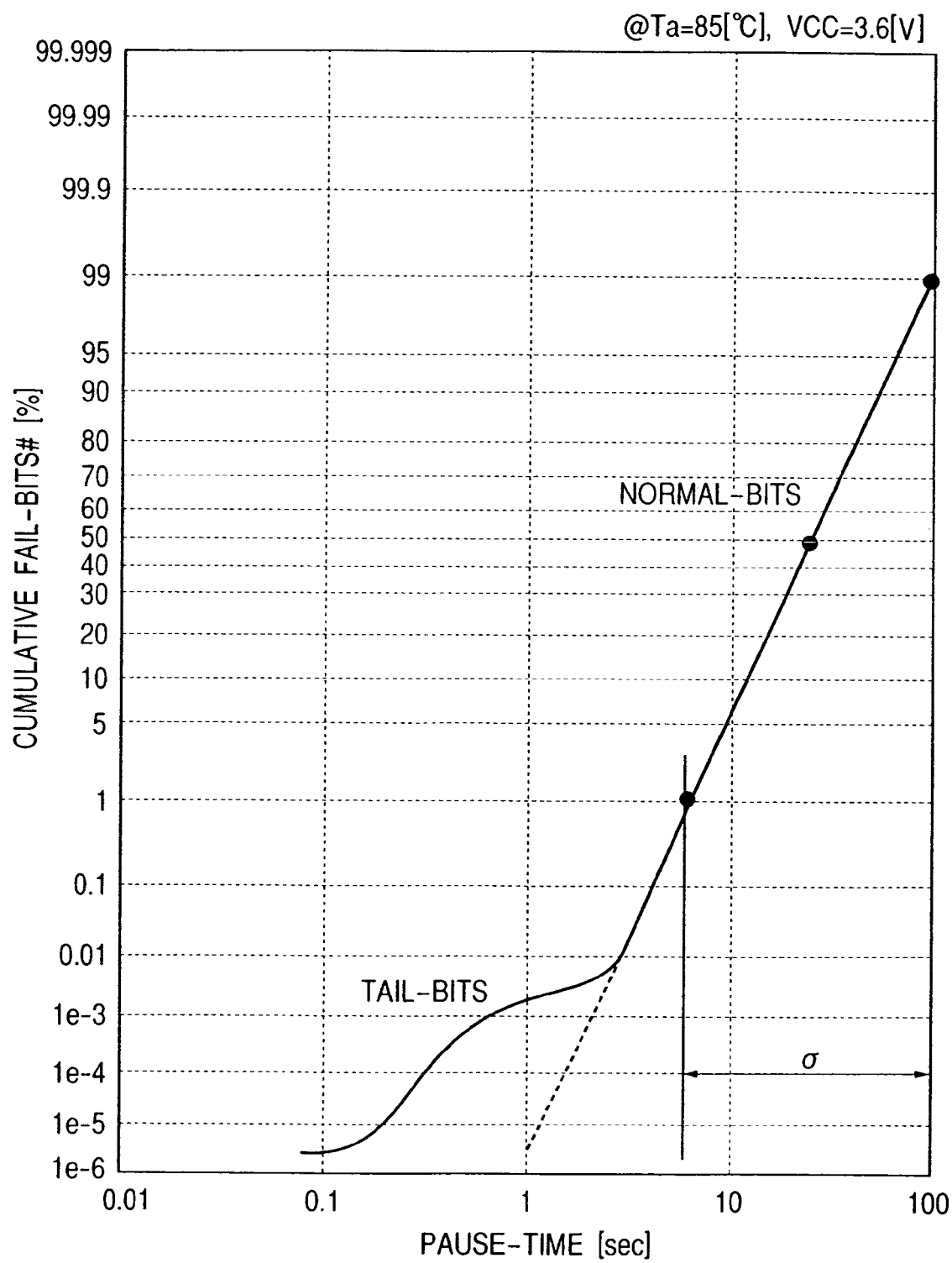
FIG. 8 is a DRAM pause refresh characteristic diagram.

FIG. 8 is a pause refresh characteristic diagram. In the diagram, the lateral axis denotes pause time and the vertical axis denotes normalized cumulative fail bits. In the diagram, a major distribution called normal bits and a minor distribution called tail bits exist. The pause of the refresh of each bit is determined by a junction leak which is parasitic on a storage node and varies in about three digits. The percentage of tail bits is about 0.0037%. In the case of 64 Mbits, the number of tail bits is about 25 Kbits. Although the pause of bits of more than 90% is 10 seconds or longer, the refresh cycle cannot be increased due to the small amount of tail bits. This characteristic including the number of tail bits is typical.

Figure 9:
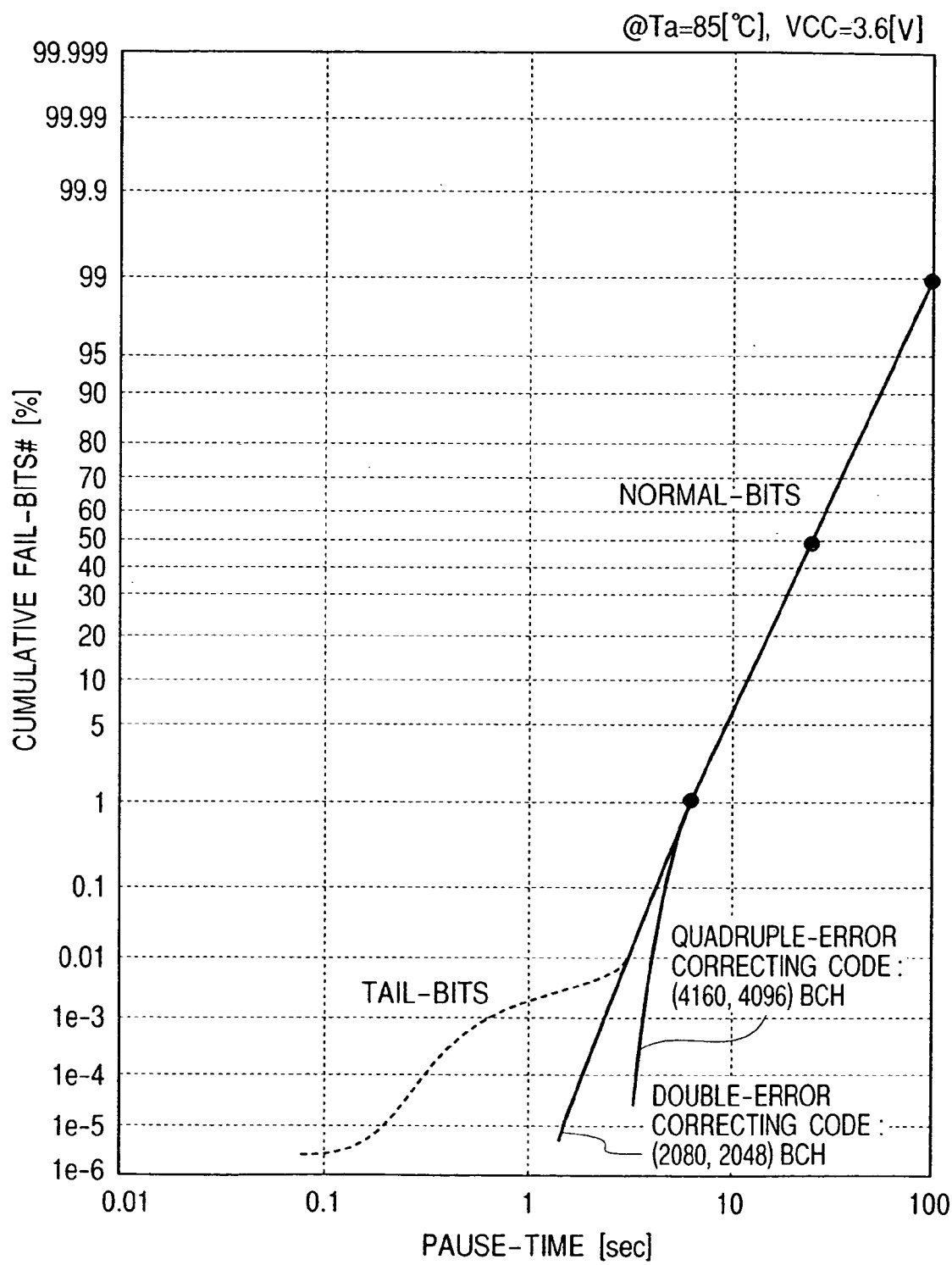
FIG. 9 is a refresh pause characteristic diagram after applying an ECC according to the invention.

FIG. 9 shows a refresh pause characteristic when the ECC circuit according to the invention is applied. For example, the tail bit can be masked with a double-error correcting code having a length of 2 k and the refresh cycle can be extended to one second or longer. Without the ECC circuit of the invention, the refresh cycle is at most 80 ms or so. As a very rare chip, a chip having a refresh cycle of 300 ms (L version) can be selected.

Figure 10:
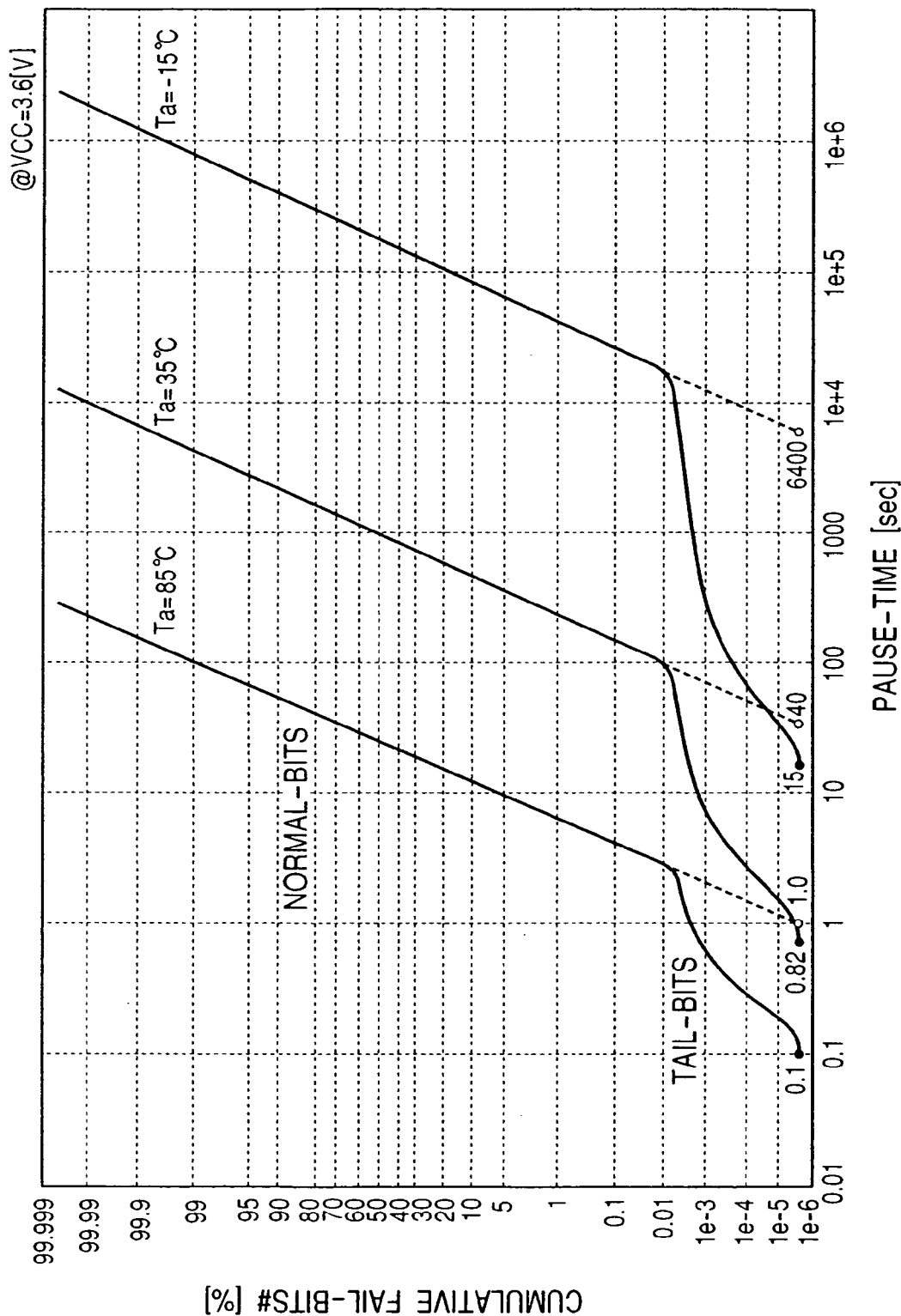
FIG. 10 is a characteristic diagram for explaining a temperature dependency of the refresh pause characteristic of the DRAM.

FIG. 10 is a characteristic diagram for explaining the temperature dependency of the refresh pause characteristic. The refresh pause characteristic largely depends on the temperature. The refresh cycle is extended in digits at the temperature becomes lower. Since the temperature dependency (activation energy) of a tail bit is twice as large as that of a normal bit, the lower the temperature becomes, the difference becomes wider. Specifically, only by changing the refresh cycle in the self refresh mode in accordance with the temperature, large reduction in current consumption can be effectively realized. When the tail bit can be masked with the ECC circuit, the effect is further increased. Paying attention to this fact, in the invention, the cell leak monitor as a temperature monitor which will be described hereinlater is useful.

Figure 11:
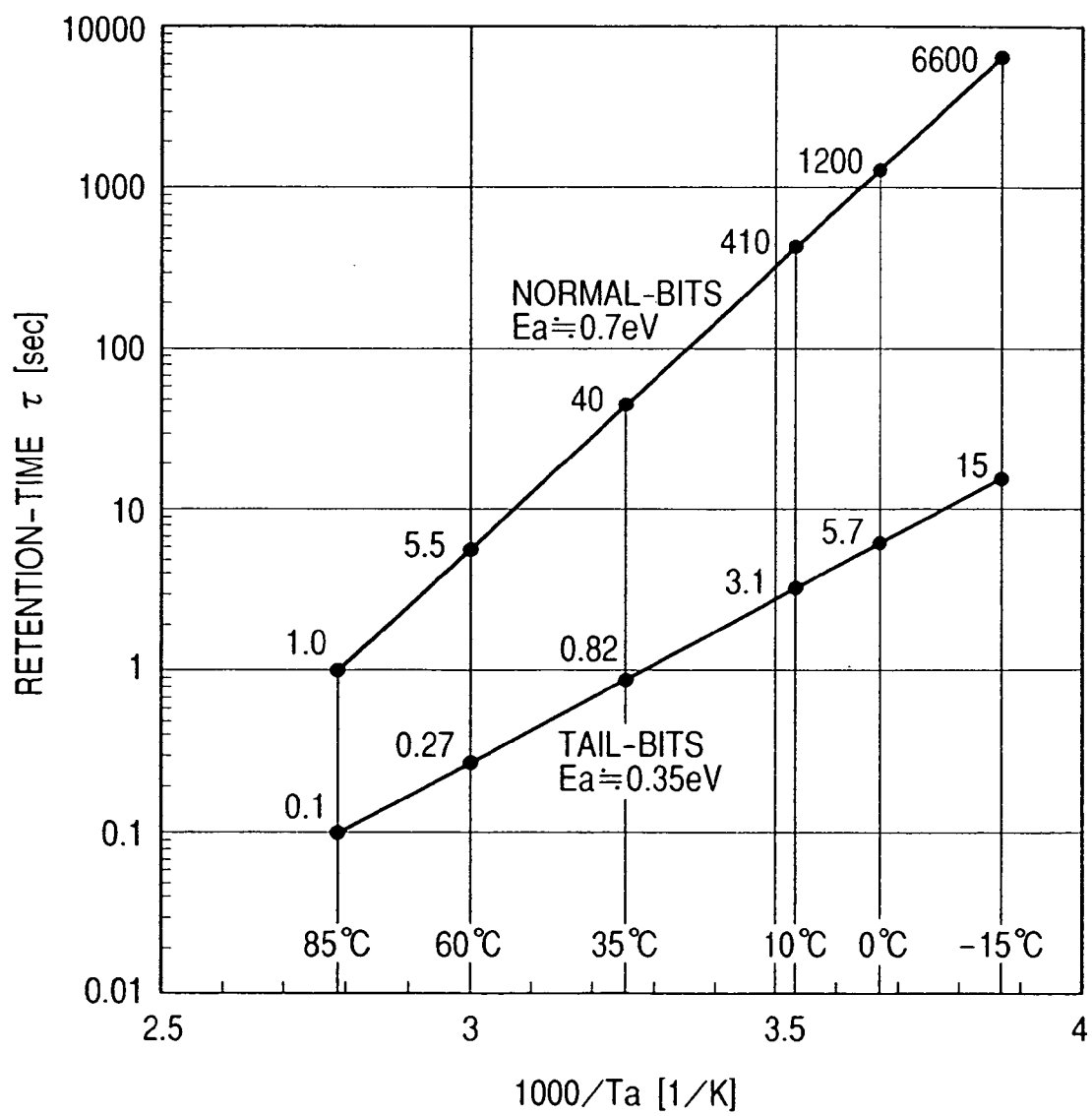
FIG. 11 is a characteristic diagram of temperature dependency of the refresh pause characteristic of the DRAM.

FIG. 11 is a characteristic diagram of temperature dependency of the refresh pause characteristic. The lateral axis denotes the inverse of ambient temperature, and the vertical axis denotes the worst values of tail bits and normal bits. The temperature dependency (activation energy) of a normal bit is twice as large as that of a tail bit. The activation energy of the tail bit is about 0.35 eV and that of the normal bit is about 0.7 eV. Those are general values. It is considered that the difference between the tail bit and the normal bit is due to different carrier generating mechanisms.

FIGS. 33A, 33B, and 33C are schematic diagrams for explaining the carrier generating mechanisms. In a normal bit, an SRH current (recombination current) at a trap level by dangling bond in the interface of an SiO2 (silicon oxide) film is dominant. Particularly, the current generated at the energy level (recombination center) in the center of the band gap is very dominant by digits. Consequently, the activation energy becomes about 0.6 eV (approximately Eg/2, in the case of silicon, Eg=1.1 eV) and is up to 0.7 eV which is high a little in practice for the reason that a diffused component shown in FIG. 33A also exists. The activation energy of the diffused component is up to 1 eV.

In contrast, in the tail bit, due to multiple trap (temporarily called here since there is no known name) by a heavy metal which very rarely exists, the activation energy further decreases and the current increases incomparably. The activation energy is about 0.35 eV in reality. The multiple trap here denotes a plurality of trap levels generated by a single failure. It is known that Cu (copper), Fe (iron), and the like in silicon (Si) generate a plurality of defect levels. According to the number of failures and levels of each bit, the junction leak current varies incomparably. Consequently, it is considered that the bits are very various as shown in FIG. 8. However, this point has not been fully clarified.

An effect of masking the tail bit by using the ECC circuit as in the example is produced as follows. As another approach from a design viewpoint regarding extension of the refresh cycle, adaptation refresh or random bit repair can be mentioned. The adaptation refresh denotes a method of providing a laser fuse circuit (ROM) for each word line and performing a control of setting a short refresh cycle for a word line including a tail bit and setting a long refresh cycle for a word line including no tail bit in a self refresh mode. By the method, a seeming refresh cycle is made longer and the standby current is reduced. The method has, however, the following big problem.

As shown in the characteristic diagram of FIG. 4, an effect on reduction in the ICC6 is small. When the longest cycle is set to be too long, most word lines are refreshed in a short cycle, so that it is not effective. When the difference between the long cycle and the short cycle is too small, it is not effective. In other words, the refresh cycle has to be set to the optimum value so that the standby current is set to the lowest value. In the bit unit like the word line, the pause tail bit (the probability of occurrence of 0.0037%) exists in most word lines (16 Kbits in the case of 64 Mbits and 128 Kbits in the case of the main word line in the hierarchical word line system). Consequently, the refresh cycle can be seemingly improved from 80 ms to only about 350 ms. This is similar to the case where an enormous amount of row (X) repair bits are provided to repair pause fails.

In an actual P (probe) test process, refresh pause is measured every word line and whether a short or long cycle has to be determined. Further, on the basis of the result, laser cutting has to be performed. An increase in the number of processes has to be said as impossible in practice. Moreover, a laser fuse circuit (ROM) provided every word line is necessary, and a refresh control circuit cannot be formed within a realistic chip size. When the unit of switching the refresh cycle is changed from the word line to the main word line, although the problem of an increase in the number of manufacturing processes and an area penalty is lessened, the effect on reduction in current consumption ICC6 as an important point is lessened more.

When the effect on reduction in current consumption ICC6 is increased to the ultimate, random bit repair is executed. The refresh pause can be improved equivalent to the device having therein the ECC circuit (the invention). However, a very wide area is necessary for the repair circuit more than that required for the adaptation refresh, so that it is unrealistic. Further, even if the problem of the area penalty can be solved, a substantial problem of VRT (Variable Retention Time) remains.

The VRT denotes refresh pause time which varies according to bits. The VRT is not special. The refresh pause is (to be strict) not always constant in all bits but varies during use of long time. Two states or three states, usually, two states, occur from a possible pause value. There are variety of bits, for example, a bit which fluctuates only once in a few years and a bit which fluctuates once every few seconds (bit which fluctuates each time it is measured). Although a bit which fluctuates in a few seconds rarely appears, a bit which fluctuates once in a few years exists in most chips.

A fluctuation bit is recognized by measuring fluctuation in refresh pause in each of bits before and after long-time reliability test. Most of the bits fluctuate between two determined values of a value (for example 11 seconds) of a normal bit in a better case and a value (for example, 220 ms) of a tail bit in the worse case. A bit of which data retaining time fluctuates as described above may be called a comet bit.

A junction leak current which determines a refresh pause is a current having a failure as shown in FIGS. 33A to 33C. It can be considered that retention time becomes variable since the trap level appears or disappears for some reason. For example, many dangling bonds existing in the interface of an SiO2 (silicon oxide) film are terminated by H (hydrogen atoms). When the device is used for long time and an energy exceeding the bonding energy is applied, H (hydrogen atoms) are uncoupled and the trap level appears suddenly. On the other hand, H (hydrogen atoms) are floating in Si (silicon). The dangling bond is terminated sometime and the trap level disappears suddenly.

In a repair process and subsequent processes, an energy exceeding the bonding energy is applied in a post process before the device is used. Specifically, when the refresh cycle is made longer by repairing (including adaptation refresh), although an effect is effectively displayed just after the repair, due to the VRT, a bit of which refresh pause fluctuates appears some time during a long time use, which becomes an error bit. The repairing process is performed in a P test process in a wafer state before a completed product is used. Consequently, a large thermal stress is applied in post processes (such as assembly), and many bits become faulty at a stage of evaluating an assembly. It can be therefore said that, in principle, only the ECC circuit can mask the tail bits of the pause and extend the refresh cycle.

That is, by masking the tail bits by using the ECC circuit, the refresh cycle can be extended. The temperature dependency of the tail bit and that of a normal bit are largely different from each other. The temperature dependency (activation energy) of a normal bit is twice as large as that of a tail bit. Moreover, the probability of occurrence of a tail bit is 0.01% or less. Consequently, the tail bit cannot be monitored, in other words, a leak source corresponding to the tail bit cannot be formed stably. By masking the tail bit by using the ECC circuit, a cell leak monitor in which the characteristics of a normal bit are reflected can be used. In a combination of the cell leak monitor in which the characteristics of a normal bit are reflected and the ECC circuit, the refresh cycle can be extended.

Figure 12:
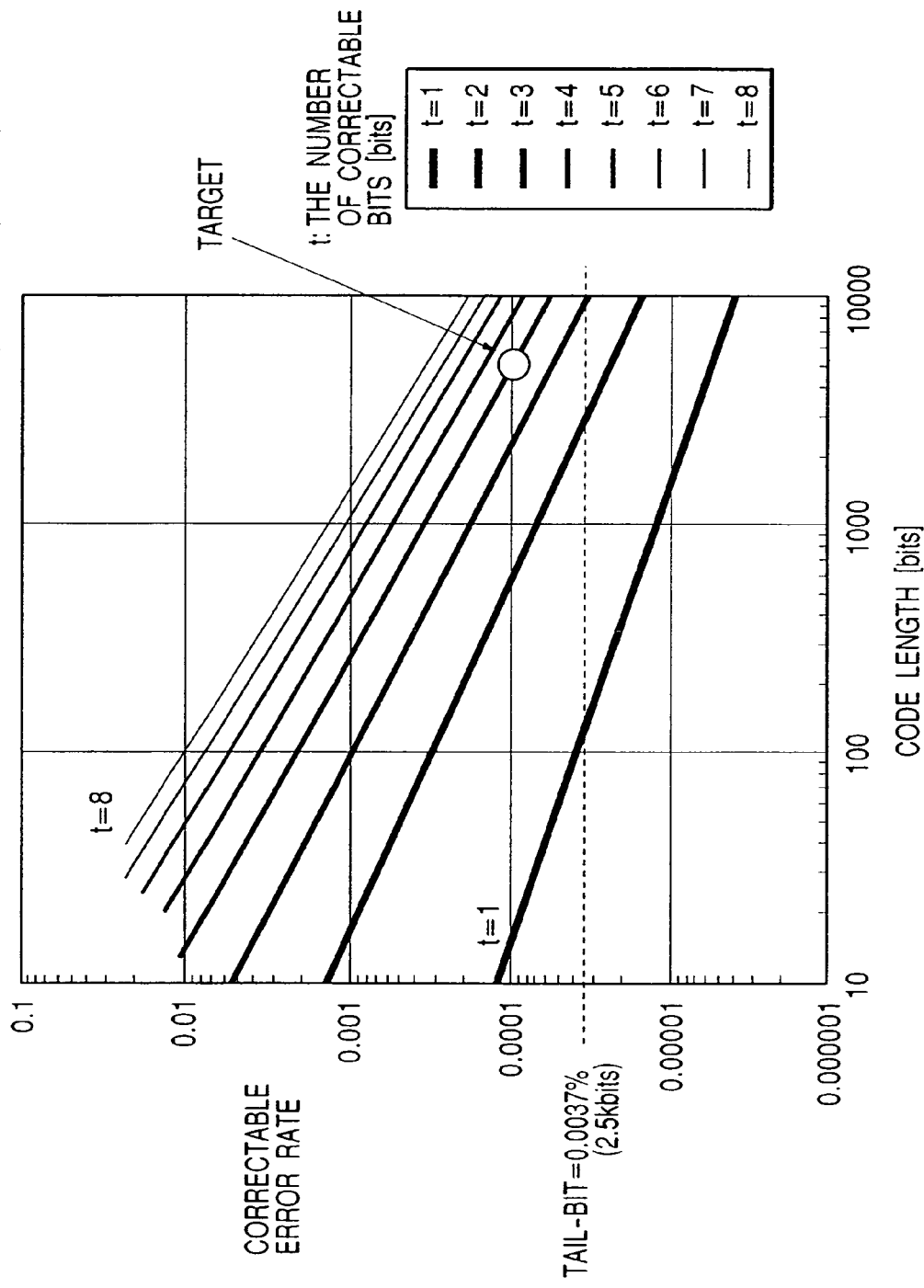
FIG. 12 is a characteristic diagram for explaining pause failure bit correctability of a t-error-correcting code (BCH code) of the DRAM.

FIG. 12 is a characteristic diagram for explaining a pause fail bit correctability of a t-error-correcting code (BSH code). In order to mask the tail bit, a double-error-correcting code having a length of 2 k is sufficient. A quadruple-error-correcting code having a length of 4 k is better so as to have an allowance. It is understood that as the code length (n) increases, the number of correcting bits (t) is increased proportionally to increase the correctability. At this time, the number of parity bits does not have to be increased so much. The above will be understood from FIG. 13. However, the circuit scale (calculation amount) increases in proportional to n×t, the limit is determined from the allowable increase in chip size.

Figure 13:
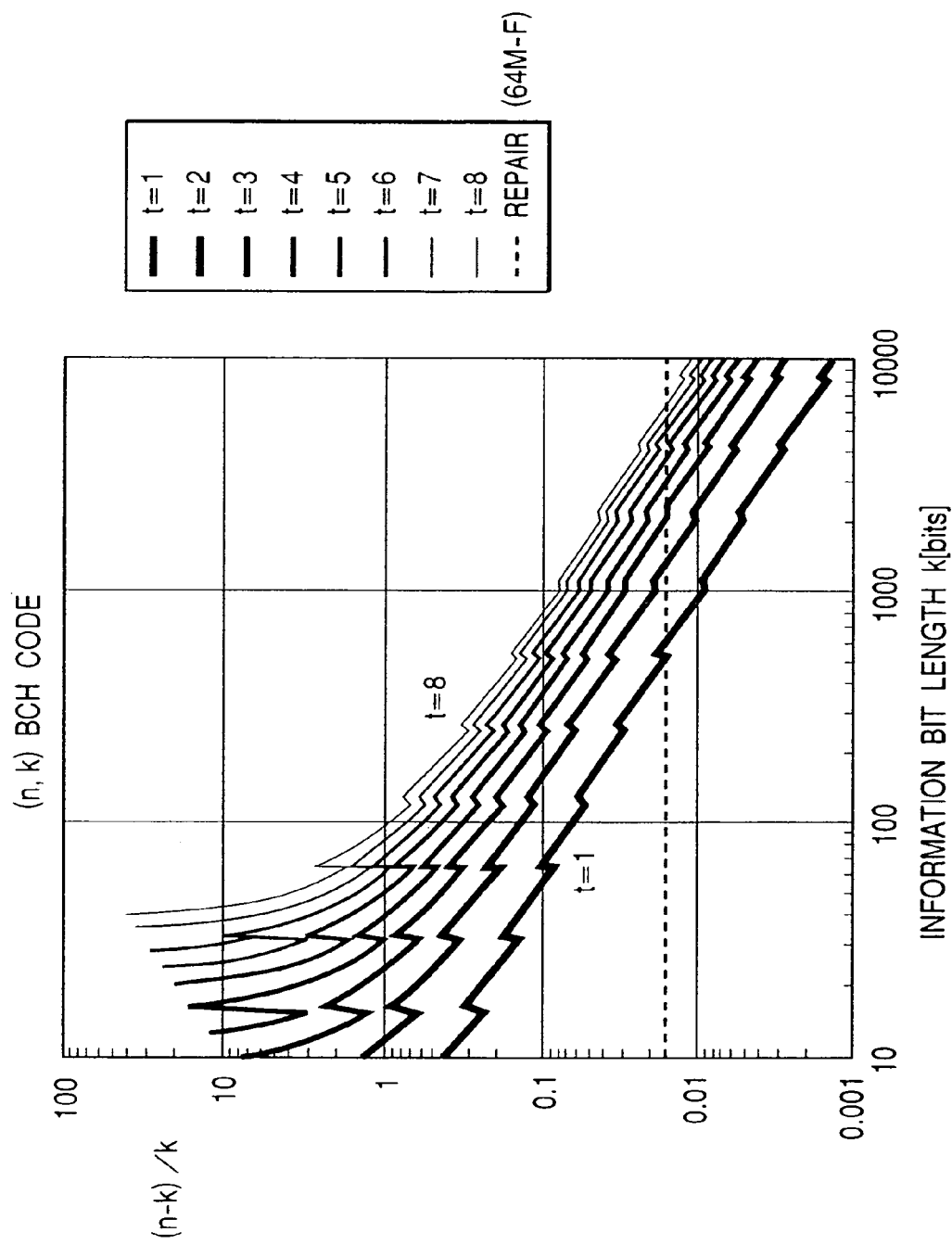
FIG. 13 is a characteristic diagram for explaining the relation between information bit length (k) of the t-error-correcting code (BCH code) of the DRAM and parity bits (n-k).

FIG. 13 is a characteristic diagram for explaining the relation between an information bit length (k) of the t-error-correcting code (BCH code) and parity bits (n-k). For redundancy repair, about 2% of redundancy bits is originally provided. Such a value is a threshold of the size of a parity area to be added For example, the BCH code of the quadruple-error-correction code having a length of 4 k (53 parity bits/4 k) or the double-error-correcting code having a length of 2 k (24 parity bits/2 k) satisfies the condition.

FIGS. 14 and 15 are bit pattern diagrams showing an example of a generator matrix and a check matrix of a (72, 64) code (correction Hamming code for one-bit correction and two-bit detection). As understood from the diagrams, an (8×8) matrix is cyclically, repeatedly provided. The check matrix is obtained only by adding a unit matrix. In such a configuration, it is sufficient to provide a circuit of calculating the (8×8) matrix and to repeatedly execute the calculation, so that the circuit scale can be reduced. In the diagrams, X denotes a transmission language, Y a reception language, P a check bit, S a syndrome, G a generator matrix, and H a check matrix.

FIG. 14 shows a parity bit calculation example and FIG. 15 is a syndrome calculation example. It is understood that the calculations are almost the same in the examples. In short, at the time of calculating a syndrome, matrix calculation is executed while including the parity bit. Since the syndrome and an error position correspond to each other in a one-to-one manner, it is sufficient to correct an error (to perform a data inverting process) by a syndrome decoder.

Figure 16:
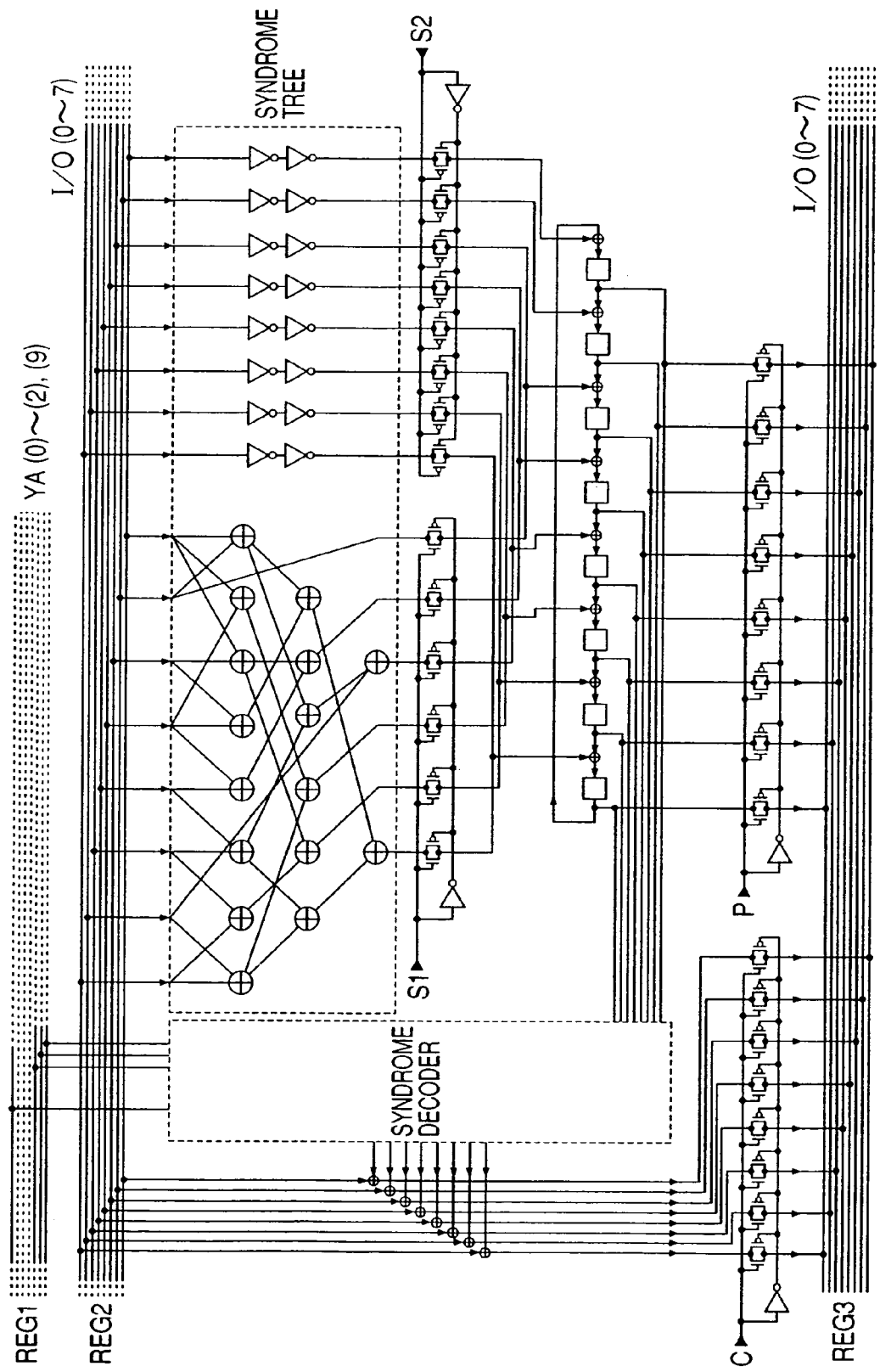
FIG. 16 is a schematic circuit diagram showing an example of an ECC circuit used for the invention.

FIG. 16 is a schematic circuit diagram of an example of an ECC circuit used for the invention. The example corresponds to those of FIGS. 14 and 15, and is directed to an ECC code (codec) of a correction Hamming code (72, 64). When the invention is applied to an SDRAM (having the ×8 configuration) of 256 Mbits, Y addresses from Y0 to Y9 can be used in the following three modes. In an area where Y9=H, it is set as a parity bit area. REG1 denotes a column address latch, REG2 denotes a data input register, and REG3 indicates a data output register.

In the ECC circuit, in an ECC syndrome mode, a signal S1 goes high (H level). When an address of data to be read is a parity bit (when Y9 is at the H level), a signal S2 goes high (H level). In an ECC parity mode, a signal P goes high (H level). All of shift resistors (eight bits) are output to the data output register REG3. Further, in an ECC correct mode, a signal C goes high (H level). Corrected data is output to the data output register REG3 via an I/O bus by the syndrome decoder.

In the correcting operation, the syndrome decoder outputs a Y address of error data in accordance with a syndrome pattern. The data is read by a read command. Since the error position (one of the eight bits) is already set to the H (high) level, the corrected data is output to the I/O bus, captured by the data output register REG, and corrected data is rewritten to a memory array by a write command.

Figure 17:
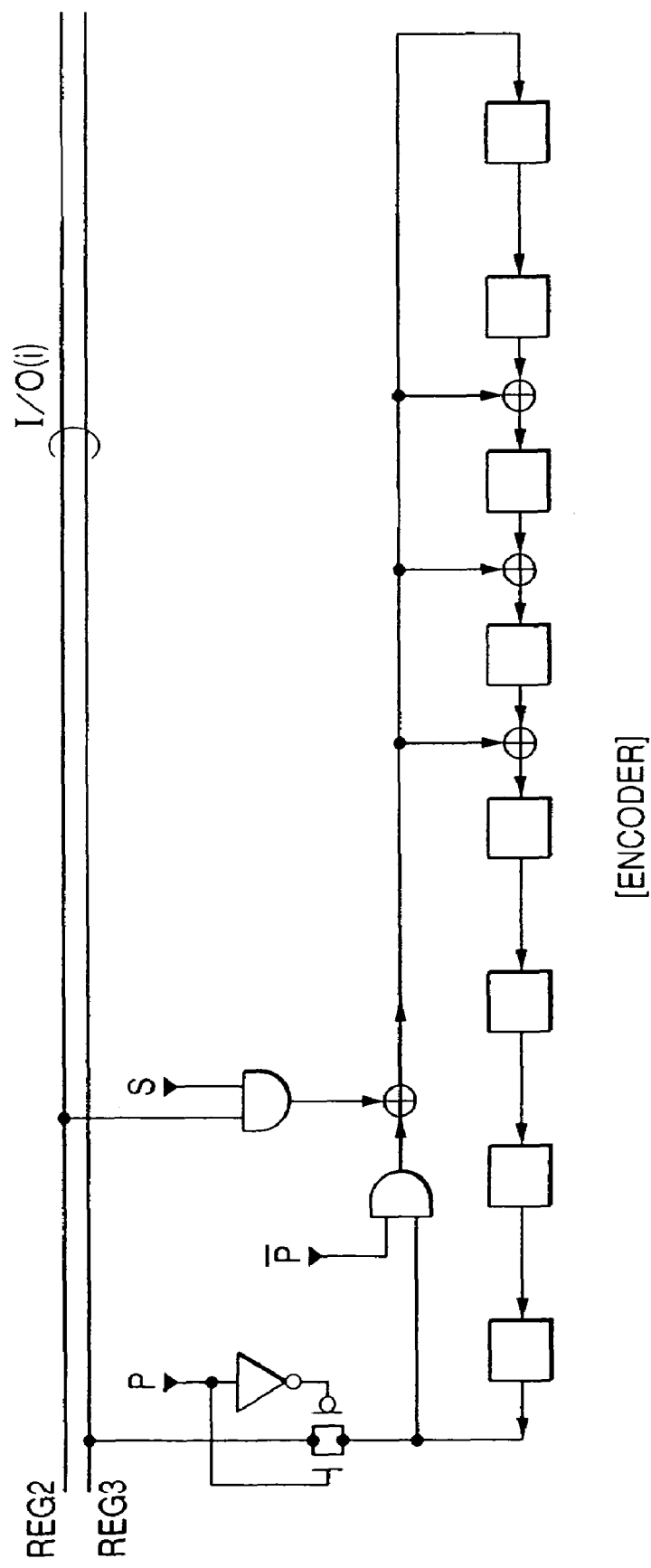
FIG. 17 is a schematic circuit diagram showing an example of a cyclic Hamming code having a length of 255 bits used for the invention.

FIG. 17 is a schematic circuit diagram of an example of a decoder of a cyclic Hamming code having a length of 255 bits used in the invention. A generator of the cyclic Hamming code of the example is $G(x)=x^8+x^4+x^3+x^2+1$. One decoder (one circuit) is provided for each bit of the I/O bus. When the I/O bus has the ×4 configuration, four circuits are provided. When the I/O bus has the ×8 configuration, eight circuits are provided. In the case of using one device (circuit), it is sufficient to provide a parallel-to-serial converter between the I/O bus and the circuit.

In the circuit of the example, in the ECC syndrome mode, the signal S is set to the H (high) level. In the ECC correct mode, the signal C is set to the H level. In any of the modes, the address space is enlarged to the parity bit area in a manner similar to the example of FIG. 16.

Figure 18:
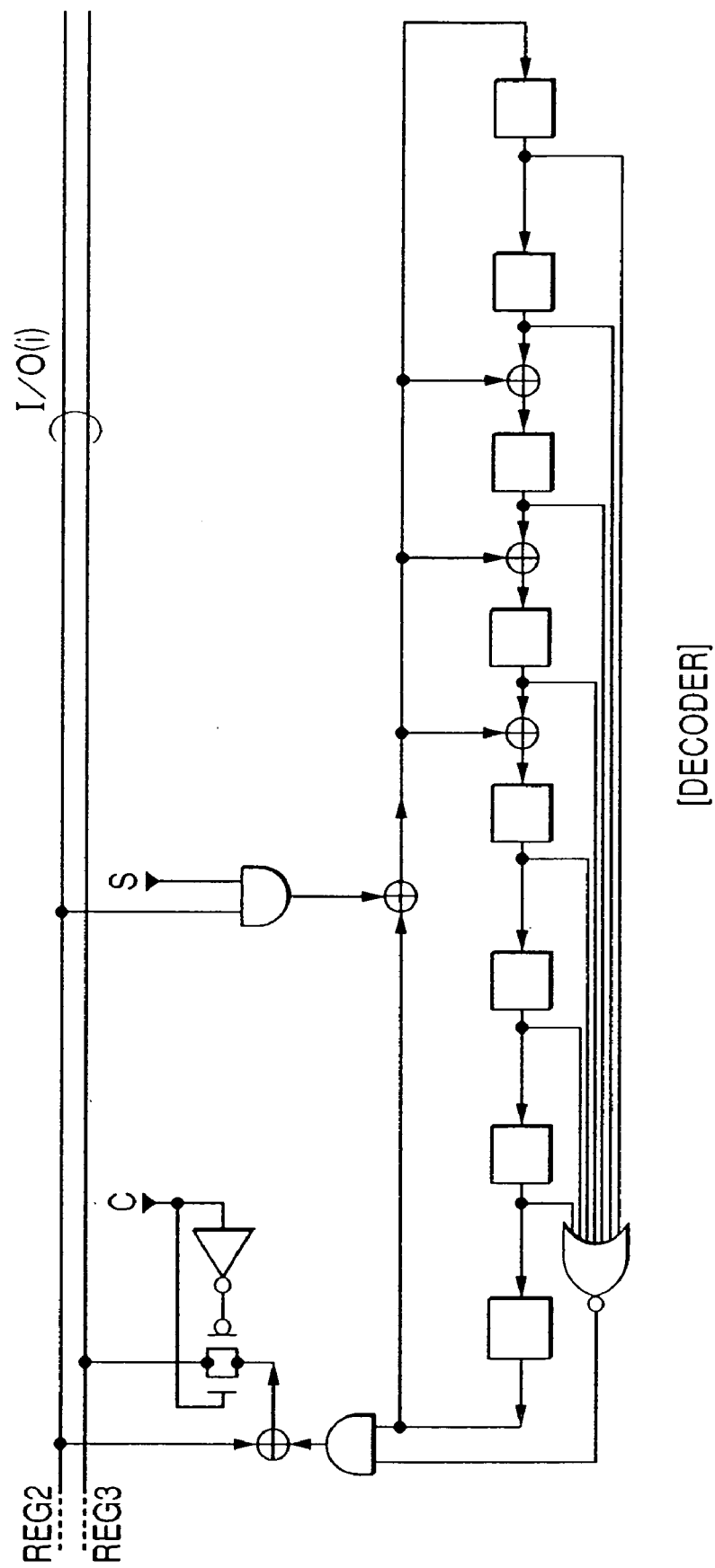
FIG. 18 is a schematic circuit diagram showing an example of a coder of a cyclic Hamming code having a length of 255 bits used for the invention.

FIG. 18 is a schematic circuit diagram of an example of an encoder of a cyclic Hamming code having a length of 255 bits used in the invention. A generator of the example is $G(x)=x^8+x^4+x^3+x^2+1$. In a manner similar to the above, one encoder (one circuit) is provided for each bit of the I/O bus. When the I/O bus has the ×4 configuration, four circuits are provided. When the I/O bus has the ×8 configuration, eight circuits are provided. Similarly, in the case of using one device (circuit), it is sufficient to provide a parallel-to-serial converter between the I/O bus and the circuit.

In the circuit of the example, in the ECC syndrome mode, the signal S is set to the H (high) level. In the ECC parity mode, the signal P is set to the H level. In any of the modes, the address space is enlarged to the parity bit area in a manner similar to the example of FIG. 16.

FIG. 19 is a schematic circuit diagram of an example of an ECC circuit (codec) of a cyclic Hamming code having a length of 255 bits used in the invention. A generator of the example is $G(x)=x^8+x^4+x^3+x^2+1$. In a manner similar to the above, one encoder (one circuit) is provided for each bit of the I/O bus. When the I/O bus has the ×4 configuration, four circuits are provided. When the I/O bus has the ×8 configuration, eight circuits are provided. As understood from the examples of FIGS. 17 and 18, the encoder and the decoder have almost the same configuration and can be commonly used as shown in FIG. 19.

In the circuit of the example, in the ECC syndrome mode, the signal S is set to the H (high) level. In the ECC parity mode, the signal P is set to the H level. In the ECC correct mode, the signal C is set to the H level. In any of the modes, the address space is enlarged to the parity bit area in a manner similar to the example of FIG. 16.

The code length can be shortened. The code length of the circuit of FIG. 16 can be increased to 255 bits at the maximum. For example, when 64 information bits are captured, a code of 72 bits (parity 8 bits) is encoded. When 64 information bits and eight parity bits are captured, a code of 72 bits is decoded. In such a manner, the circuit has the function equivalent to the (72, 64) code shown in FIG. 16. In the case of the circuit system, not only the circuit scale can be largely reduced but also the correctability can be freely changed by changing the code length (in a state where the number of parity bits is fixed to eight). Also in the case of the BCH code (t-error-correcting code), a basic circuit configuration is the same. For simplicity, the case of the cyclic Hamming code is explained.

Figure 20:
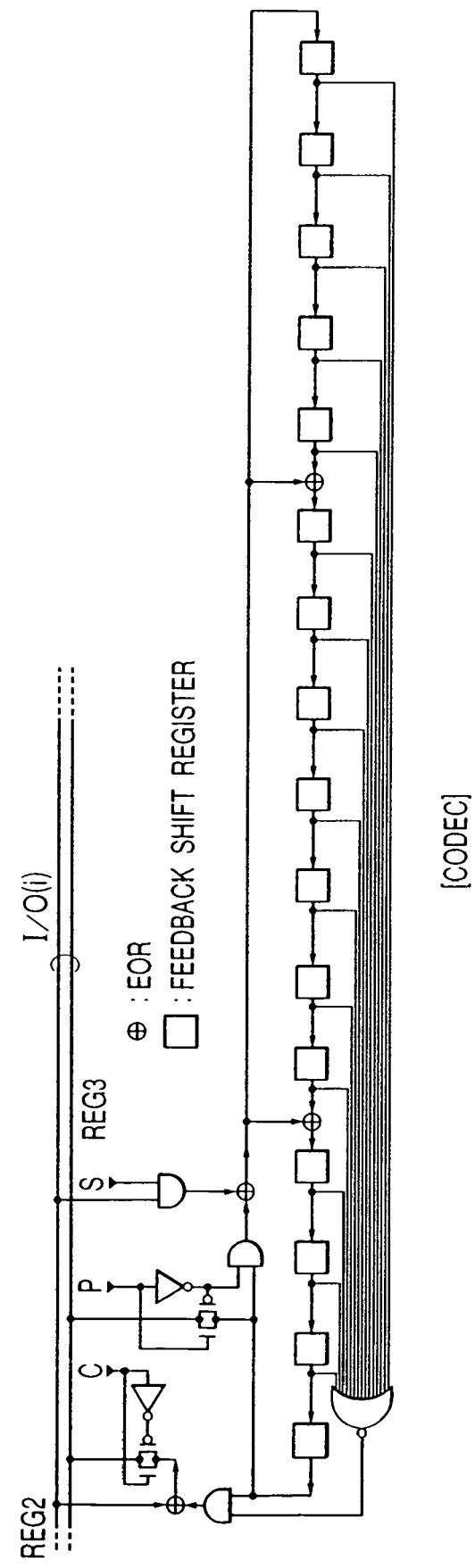
FIG. 20 is a schematic circuit diagram showing an example of an ECC circuit of a cyclic Hamming code having a length of 32767 bits used for the invention.

FIG. 20 is a schematic circuit diagram of an example of an ECC circuit of a cyclic Hamming code having a length of 32767 bits used in the invention. A generator of the cyclic Hamming code of the example is $G(x)=x^{16}+x^{12}+x^5+1$. The generator conforms to the recommendation of CCITT (Comité Consultatif International de Téléphonie et de Télégraphie). The circuit can be freely adapted to the 4x and 2 k configurations, and the parity bits can be also saved (16 parity bits are fixed).

As a valid cyclic code other than the ECC used in the invention, a fire code can be used. The fire code can be generated by using a similar circuit configuration, and a burst error can be corrected. Specifically, even when a bit line error or a word line error which cannot be detected in a normal test appears in a pause test, it can be corrected. However, the number of parity bits is larger as compared with the Hamming code. Since a pause error bit, particularly, a tail bit is a physical one fail, the pause error is a unidirectional error.

To increase the error detectability, it is therefore effective to use a t-EC/AUDE code (t-error-correcting code/all-unidirectional-error-detecting code) which is used in combination with a Berger code, correct a symmetrical error up tot-pieces, and detect all unidirectional errors. The fire code is disclosed by Fire P., "A Class of Multiple-Error-Correcting Codes for Non-Independent Errors", Sylvania Report RSL-E-1., Sylvania Electric Defense Lab. Mountain View, Calif. (1959). The Berger code is disclosed by Berger J. M., "A Note on Error-Detecting Codes for Asymmetric Channels", Inform. and Control, Vol. 4, pp. 68 to 73 (1961).

Figure 21:
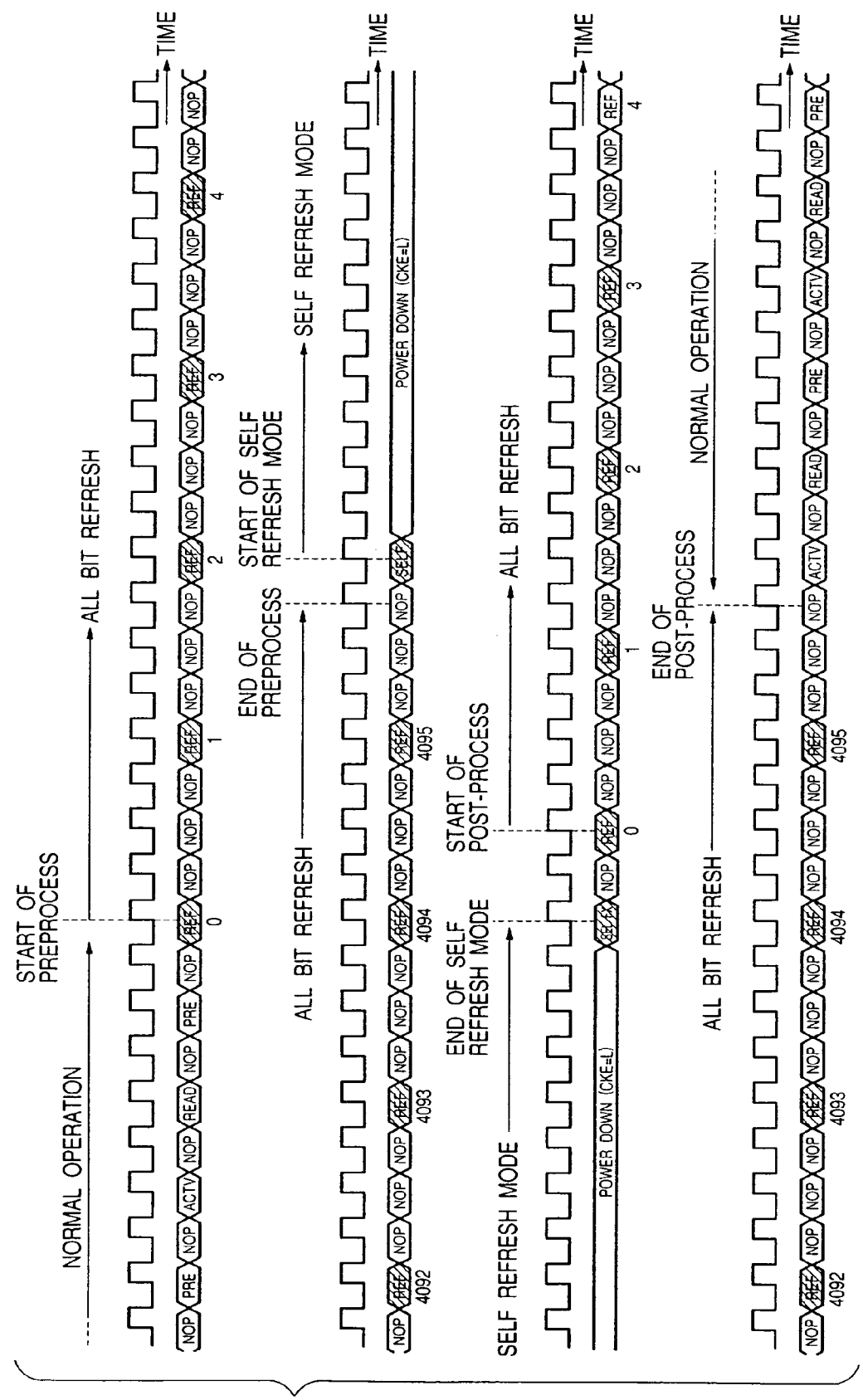
FIG. 21 is a timing chart showing an example of a refresh operation of an SDRAM according to the invention.

FIG. 21 is a timing chart of an example of a refresh operation of the SDRAM according to the invention. In the example, in a manner similar to the conventional SDRAM, before entering a self refresh mode from a normal operation mode, (1) all the bits are refreshed as a preceding process, thereby equalizing the storage charge amounts of all of the bits. After that, (2) the self refresh mode is started, and (3) the SDRAM enters a self refresh mode. In the case of returning to the normal mode from the self refresh mode, the self refresh mode is finished, and (5) all the bits are refreshed as a post process, thereby returning to the normal operation mode. The function is useful when the SDRAM is mounted on a conventional memory system.

Figure 22:
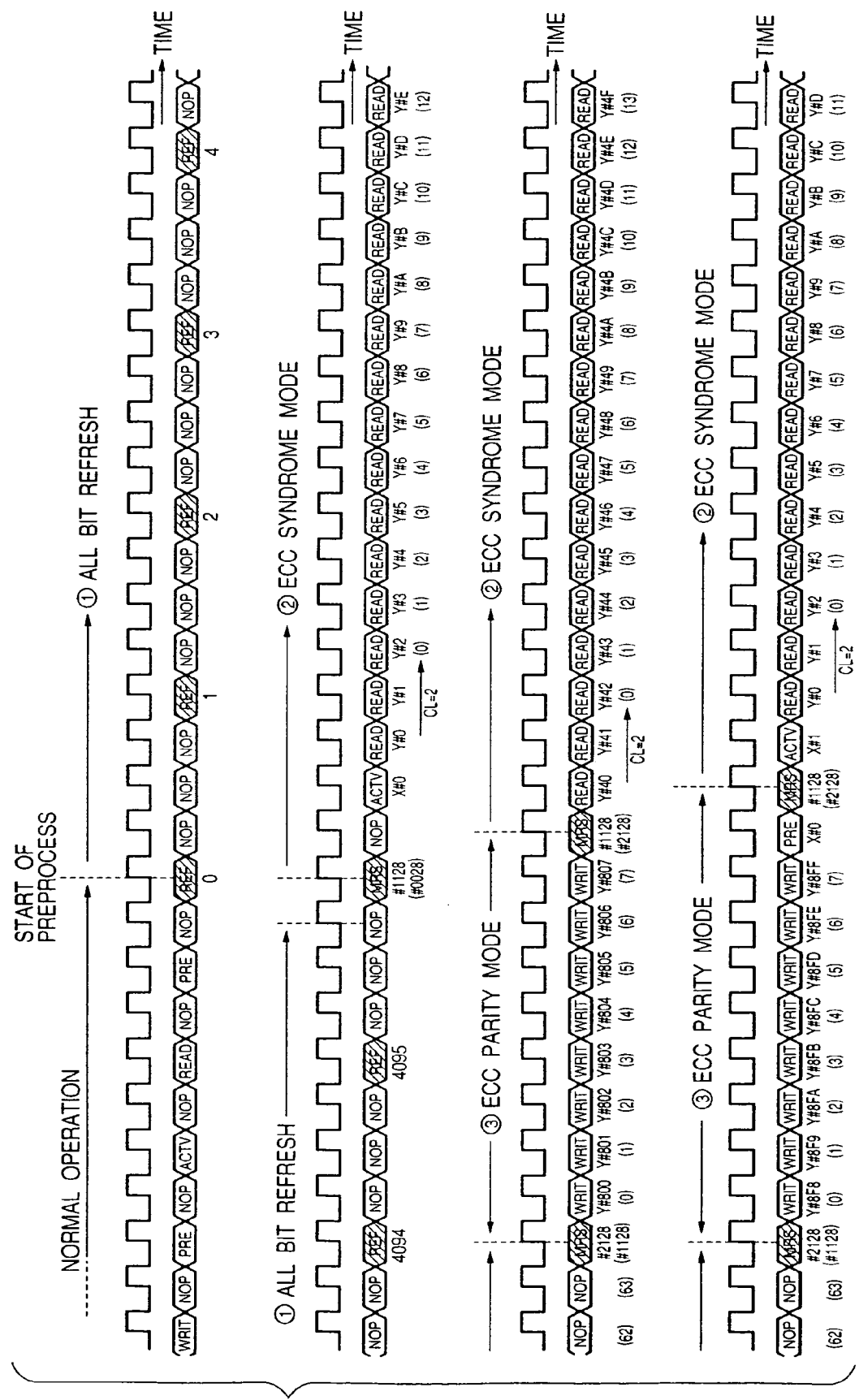
FIG. 22 is a timing chart of a part for explaining a data storing method of a dynamic RAM using the ECC circuit according to the invention.
Figure 23:
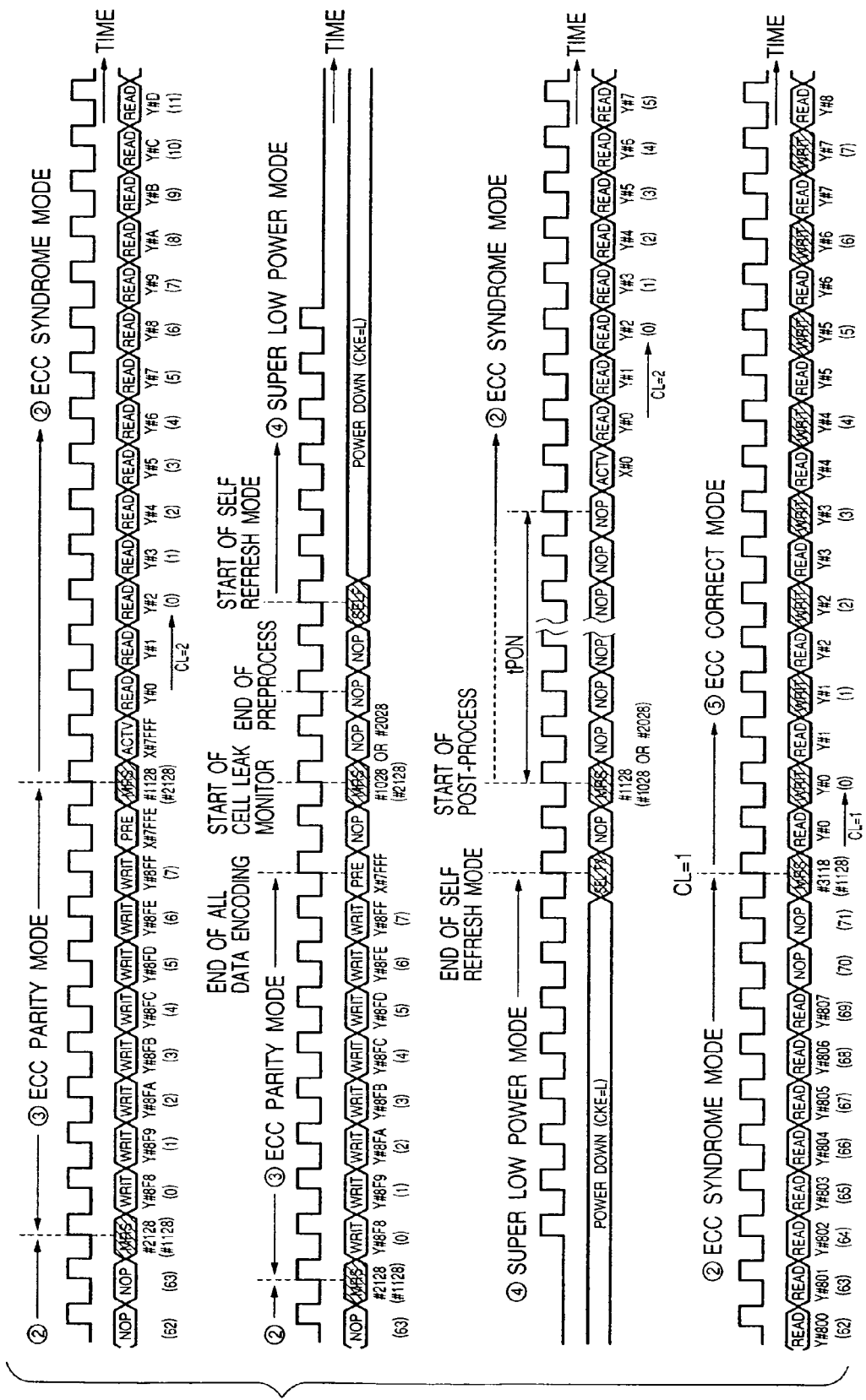
FIG. 23 is a timing chart of another part for explaining the data storing method of the dynamic RAM using the ECC circuit according to the invention.
Figure 24:
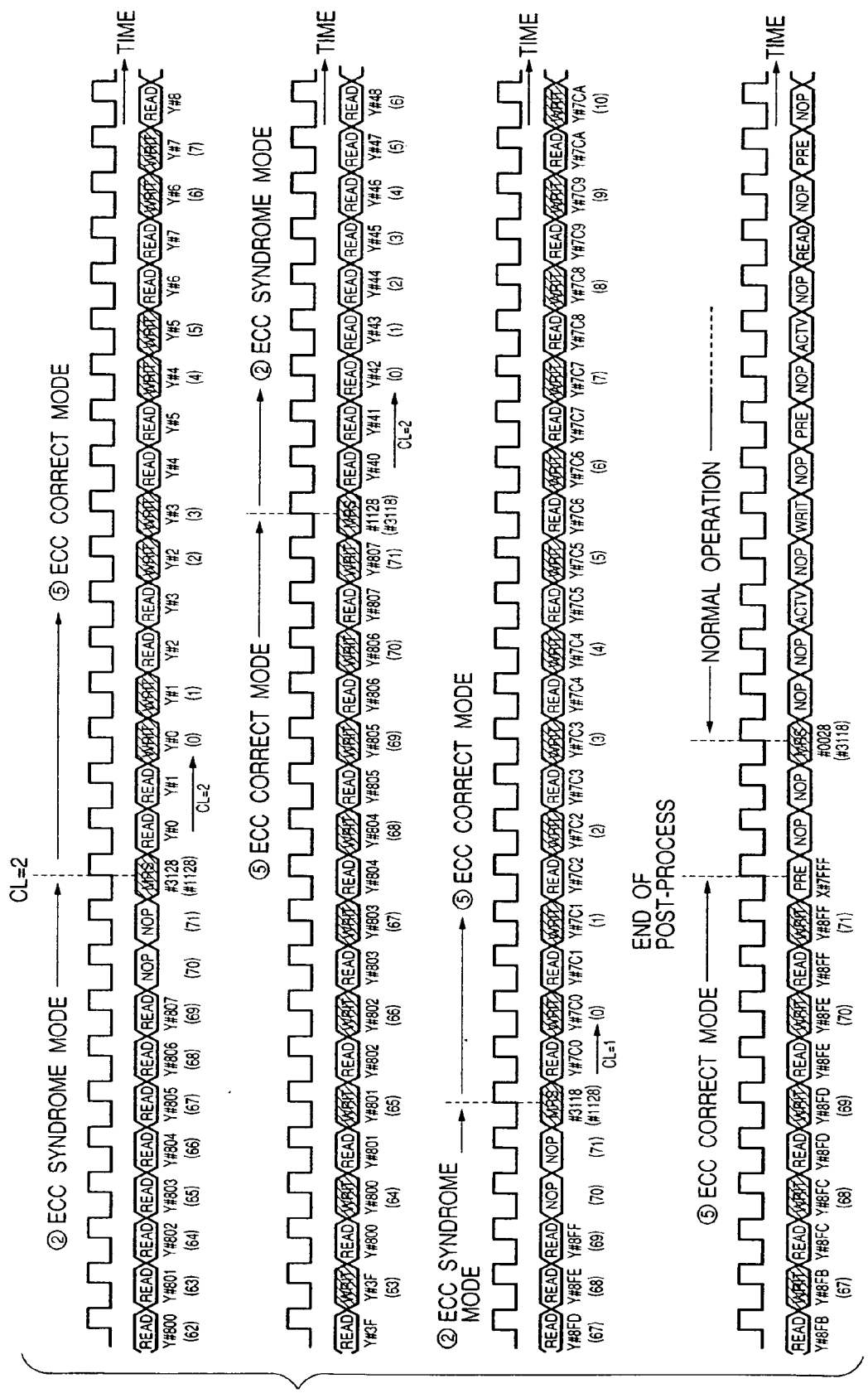
FIG. 24 is a timing chart of the rest for explaining the data storing method of the dynamic RAM using the ECC circuit according to the invention.

FIGS. 22 to 24 are timing charts for explaining the data storing method of the dynamic RAM using the ECC circuit according to the invention. In the example, the invention is applied to an SDRAM (having the ×4 configuration) of 256 Mbits. In the ECC circuit, the cyclic hamming code (72, 64 code) of FIG. 19 is constructed in the Y direction, and the parity bit is increased in the Y direction (refer to FIG. 27).

In FIG. 22, before performing a self refresh by the super low power mode according to the invention from the normal operation mode, (1) all the bits are refreshed as a preceding process, thereby equalizing the storage charge amounts of all of the bits. After that, (2) an ECC syndrome mode is executed. In the ECC syndrome mode (2), data of 64 bits are read one by one by the read command. In an ECC parity mode (3), generated eight check bits are written in a storage area increased in the Y direction by the write command.

By alternately repeating the ECC syndrome mode (2) and the ECC parity mode (3), all bits are encoded. In FIG. 23, when the encoding of all the data is finished, the cell leak monitor is started to finish the preceding process and to start the self refresh mode. A self refresh is carried out in the super low power mode (4). The refresh cycle in the super low power mode is controlled by the cell leak monitor and is set to be a long cycle of about 10 seconds at room temperature. Subsequently, a concentrated refresh is performed. During a period from the end of the refresh on all the bits until the start of the next concentrated refresh, the powers of unnecessary internal circuits are interrupted. In the self refresh in the super low power mode (4), an error occurs in a tail bit but is left as it is.

In the case of returning to the normal mode from the super low power mode (4), the ECC syndrome mode (2) is started. At the time of start of the post process, a power-on time tPON is set, and a power supply operation time necessary for the internal circuits to perform normal operation is provided. When the self refresh in which the refresh cycle is set to about 1 second (or longer) and the cell leak monitor is not used is carried out in place of the super low power mode, the powers of the internal circuits are untouched. It is consequently unnecessary to set the power-on time tPON.

After elapse of the power-on time tPON, 72 bits are read by the read command, and the SDRAM enters the ECC correct mode (5). In the ECC correct mode (5), the error of the tail bit is corrected by the read and write commands and errors in all the tail bits are corrected in such a manner. In order to prevent data from being destroyed by pause time during encoding or decoding all the bits in FIGS. 22, 23, and 24, a distributed refresh is properly inserted. In FIG. 24, after completing the post process, a normal operation can be performed.

Figure 25:
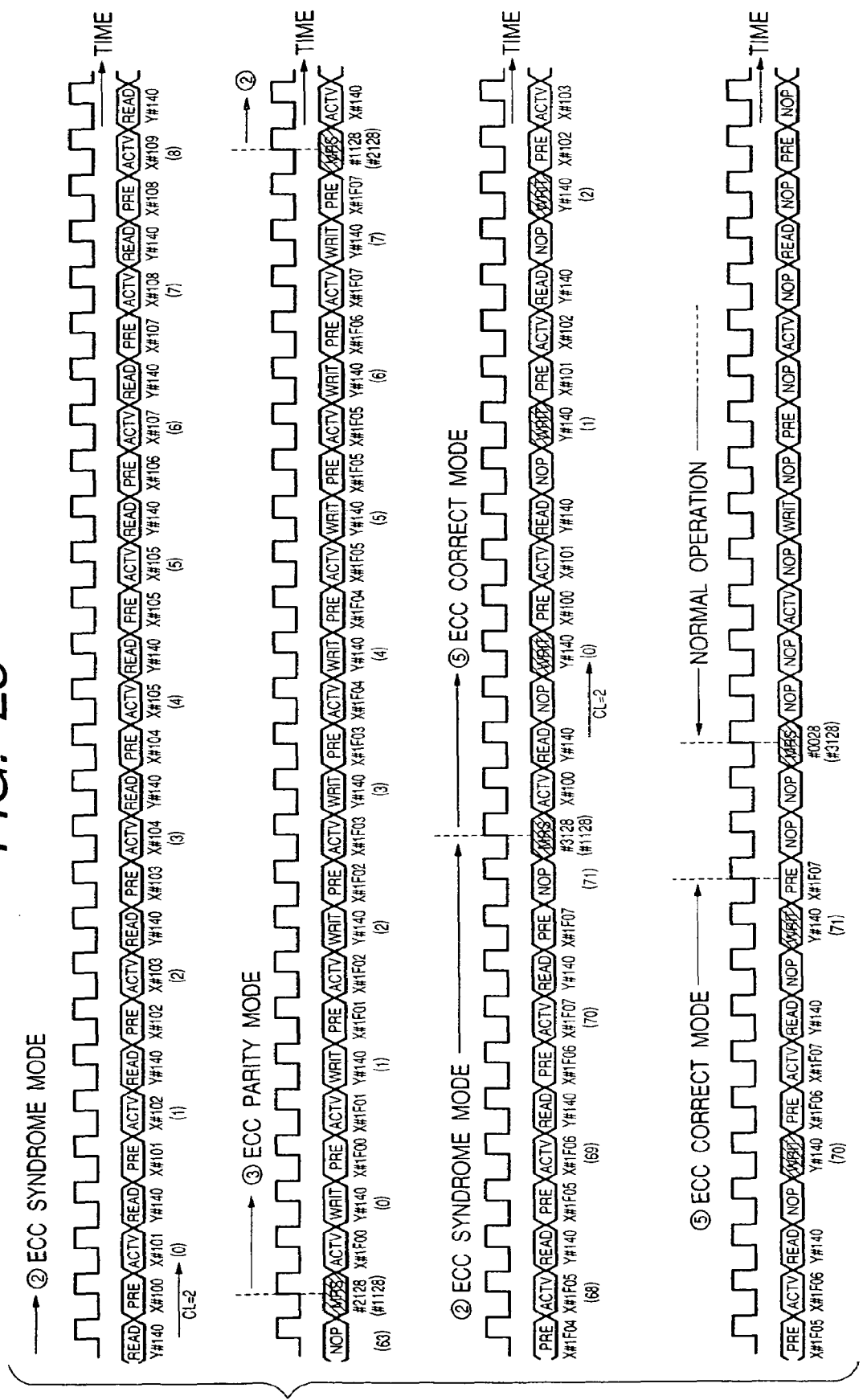
FIG. 25 is a timing chart for explaining the data storing method of the dynamic RAM using the ECC circuit according to the invention.

FIG. 25 is a timing chart for explaining the data storing method of the dynamic RAM using the ECC circuit according to the invention. In the example, the invention is applied to an SDRAM (having the ×4 configuration) of 256 Mbits. In the ECC circuit, the cyclic Hamming code (72, 64 code) of FIG. 19 is constructed in the X direction and the parity bits are increased in the X direction (refer to FIG. 28).

In the example, data may be captured to the ECC circuit by an X scan. The procedure is quite the same as that of FIGS. 22 to 24. In the case of the X scan, refresh is naturally conducted, so that the distributed refresh to prevent data from being destroyed in the pause time while all bits are encoded or decoded is unnecessary.

In description of the operations of FIGS. 22 to 25, the invention is applied to the SDRAM (having the ×4 configuration) of 256 Mbits. In many cases, a memory chip is designed so as to be adapted to the ×4, ×8, and ×16 configurations. Consequently, in any of the word organizations, the memory chip can be adapted to all of the cases when the ×4 configuration is used in three modes of the ECC syndrome mode, ECC parity mode, and ECC correct mode. With the configuration, the ECC circuit to be mounted does not have to be changed according to the word organization and DQ pins do not become insufficient.

Figure 26:
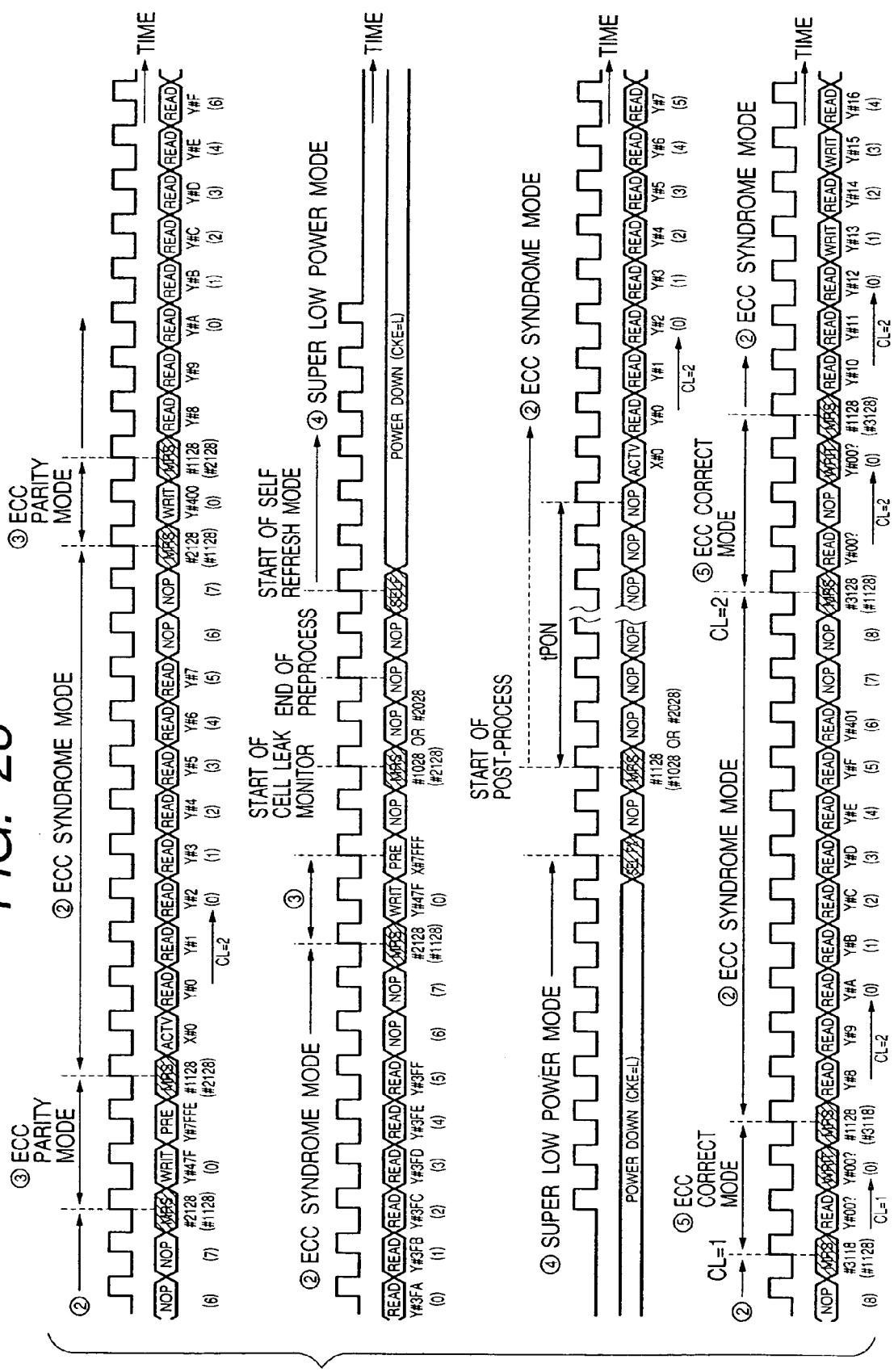
FIG. 26 is a timing chart for explaining the data storing method of the dynamic RAM using the ECC circuit according to the invention.

FIG. 26 is a timing chart for explaining the data storing method of a dynamic RAM using the ECC circuit according to the invention. In the example, the invention is applied to an SDRAM (having the ×8 configuration) of 256 Mbits. In the ECC circuit, the correction Hamming code (72, 64 code) is constructed in the Y direction and the parity bits are increased in the Y direction (refer to FIG. 27).

In the example as well, a procedure is substantially the same as the example of FIGS. 22 to 24. However, since the ECC circuit (one) of the example processes eight bits in one cycle, the following points are different. (1) 64-bit data is read in eight cycles, while 64 cycles are necessary in the example of FIGS. 22 to 24. (2) Even when a Y address is input in the ECC correct mode, it is invalid. A process is performed in two cycles of read and write cycles.

Figure 27:
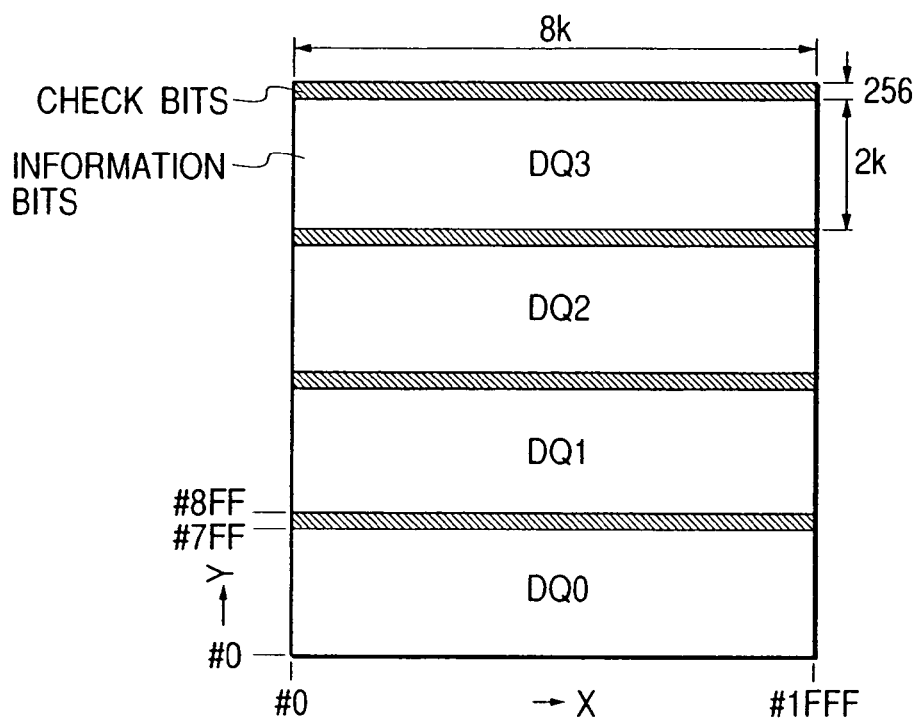
FIG. 27 is a memory area use diagram of an example of the DRAM according to the invention.

FIG. 27 is a memory area use diagram of an example of the DRAM according to the invention. In the example, the check bit areas is increased in the Y direction in correspondence with the example of FIGS. 22 to 24.

Figure 28:
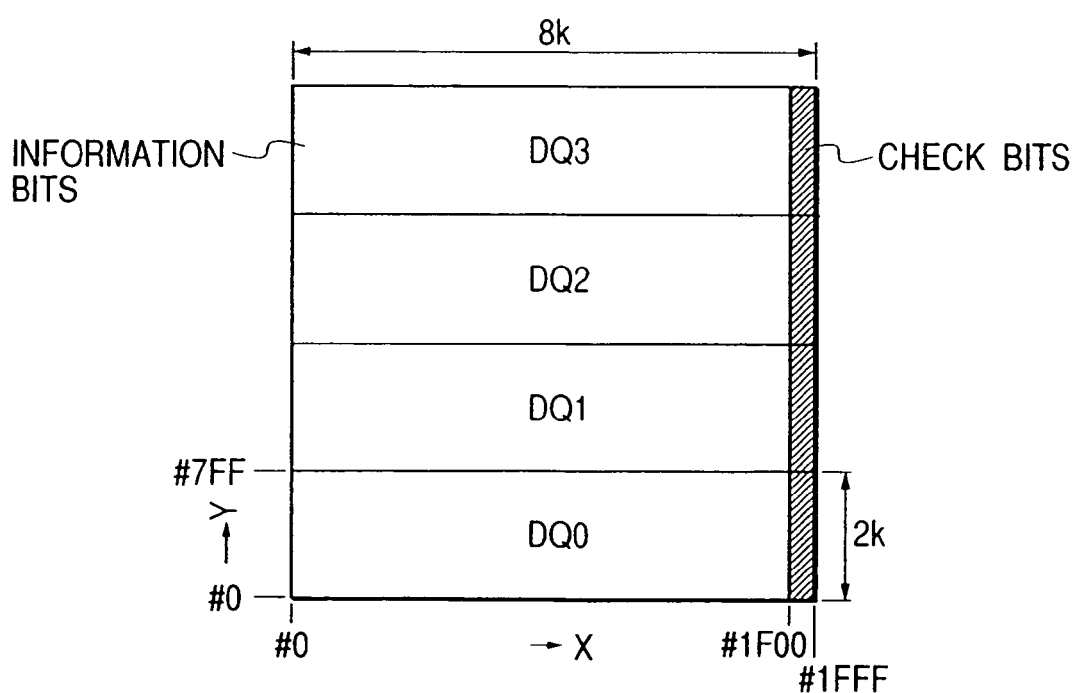
FIG. 28 is a memory area use diagram of another example of the DRAM according to the invention.

FIG. 28 is a memory area use diagram of another example of the DRAM according to the invention. In the example, the check bit area is increased in the X direction in correspondence with the example of FIG. 25.

Figure 29:
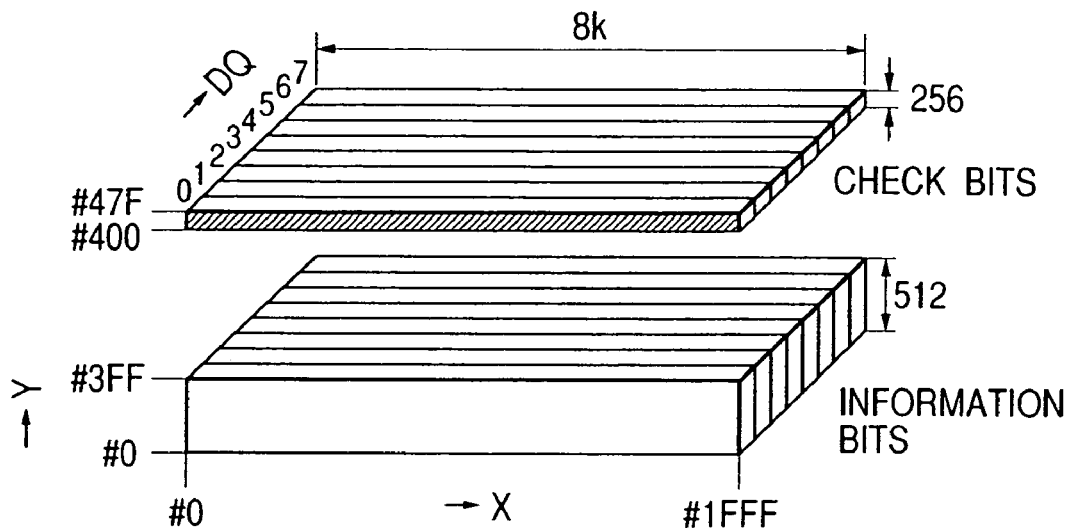
FIG. 29 is a memory area use diagram of another example of the DRAM according to the invention.

FIG. 29 is a memory area use diagram of another example of the DRAM according to the invention. In the example, the check bits are increased in the Y direction. The example corresponds to the example of FIG. 26 in which the process is performed on the eight-bit unit basis.

Figure 30:
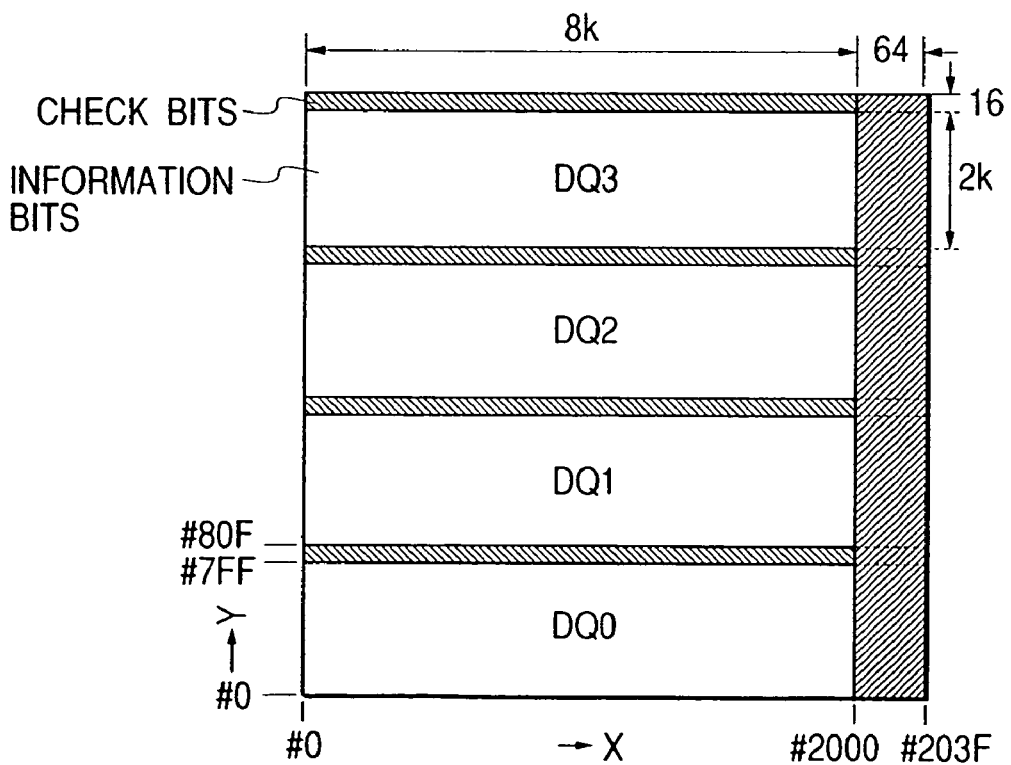
FIG. 30 is a memory area use diagram of another example of the DRAM according to the invention.

FIG. 30 is a memory area use diagram of further another example of the SDRAM according to the invention. In the example, the invention is applied to a product code. The ECC circuit is directed to the configuration in which the cyclic Hamming codes, which are (2064, 2048) codes are provided in both the X and Y directions.

The parity bits are increased in both X and Y directions. With only the Hamming code, only one bit can be corrected (minimum distance 3). When the product code is used, the minimum distance becomes the product of two codes, that is, nine, so that the error correctability equivalent to the quadruple-error-correcting code having a length of 4 Kbits is obtained. In this case, the circuit scale is smaller and the number of parity bits is almost the same as compared with a quadruple-error-correcting BCH code. In this case, the number of cycles required for the ECC process (encoding and decoding) increases. However, since the standby time is sufficient longer than the ECC process time, it can be considered that there is no problem. By using such a product code, a burst error such as a word line error or a bit line error can be also corrected.

Figure 31:
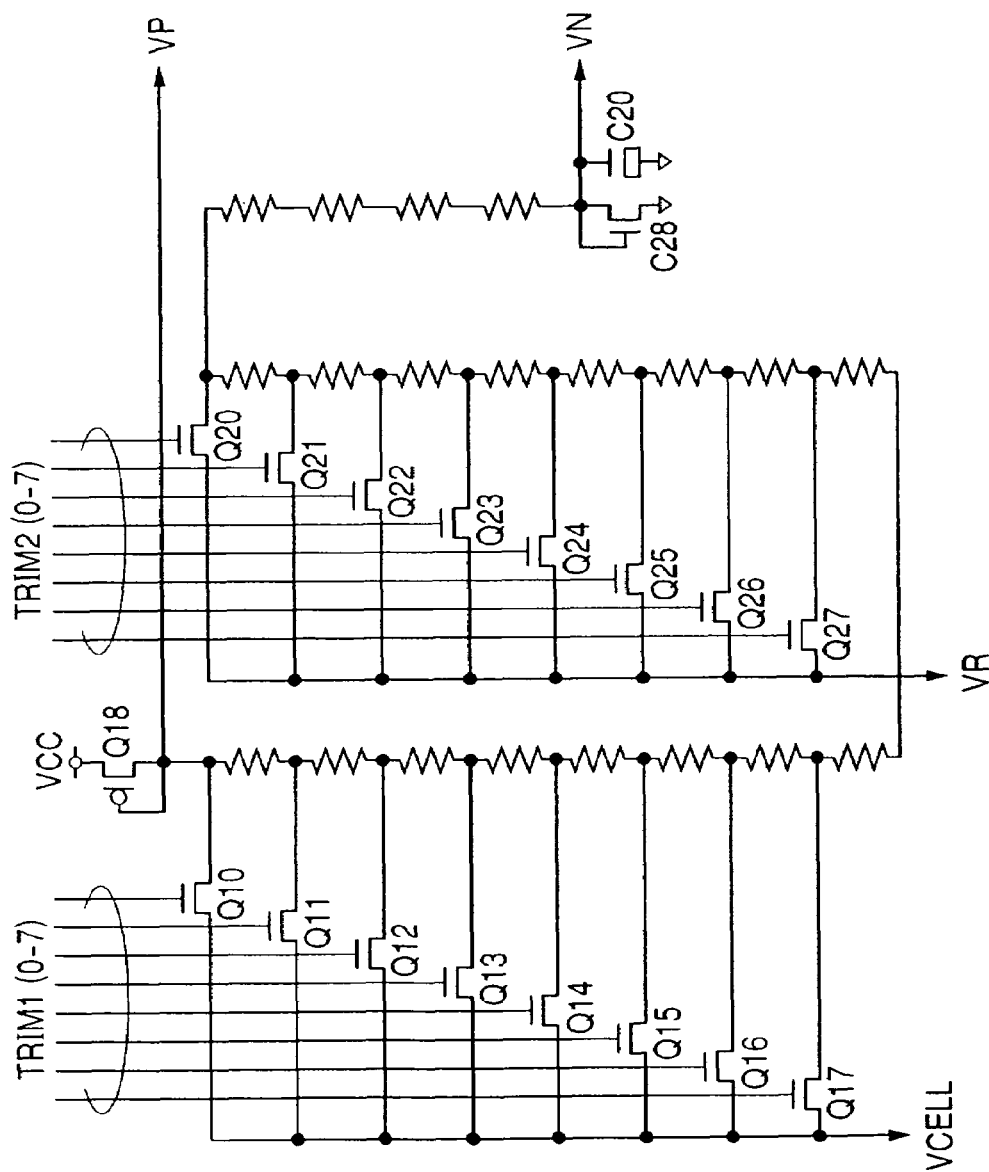
FIG. 31 is a circuit diagram showing an example of a voltage setting circuit used for a cell leak monitor used for the invention.

FIG. 31 is a circuit diagram showing an example of a voltage setting circuit used for a cell leak monitor employed in the invention. In the example, switch MOSFETs Q10 to Q18 and Q20 to Q27 each for short-circuiting a resistor in a series resistance circuit are provided and a switching control is performed by trimming signals TRM1 (0 to 7) and TRM2 (0 to 7). The trimming signals TRM1 (0 to 7) and TRM2 (0 to 7) are, but not limited, generated by blowing a fuse with a laser beam or the like.

By the switching control, the number of resistors inserted between the source voltage VCC and the ground potential of the circuit is selected, a current flowing to the resistors is adjusted, gate-source voltages VP and VN of the P-channel type MOSFET Q18 and the N-channel type MOSFET Q28 are generated, and currents of a P-channel type current source MOSFET and an N-channel type current source MOSFET are set by a current mirror circuit. A voltage VR is a reference voltage for cell leak monitor, and a voltage VCELL is an input voltage written to a capacitor.

Figure 32:
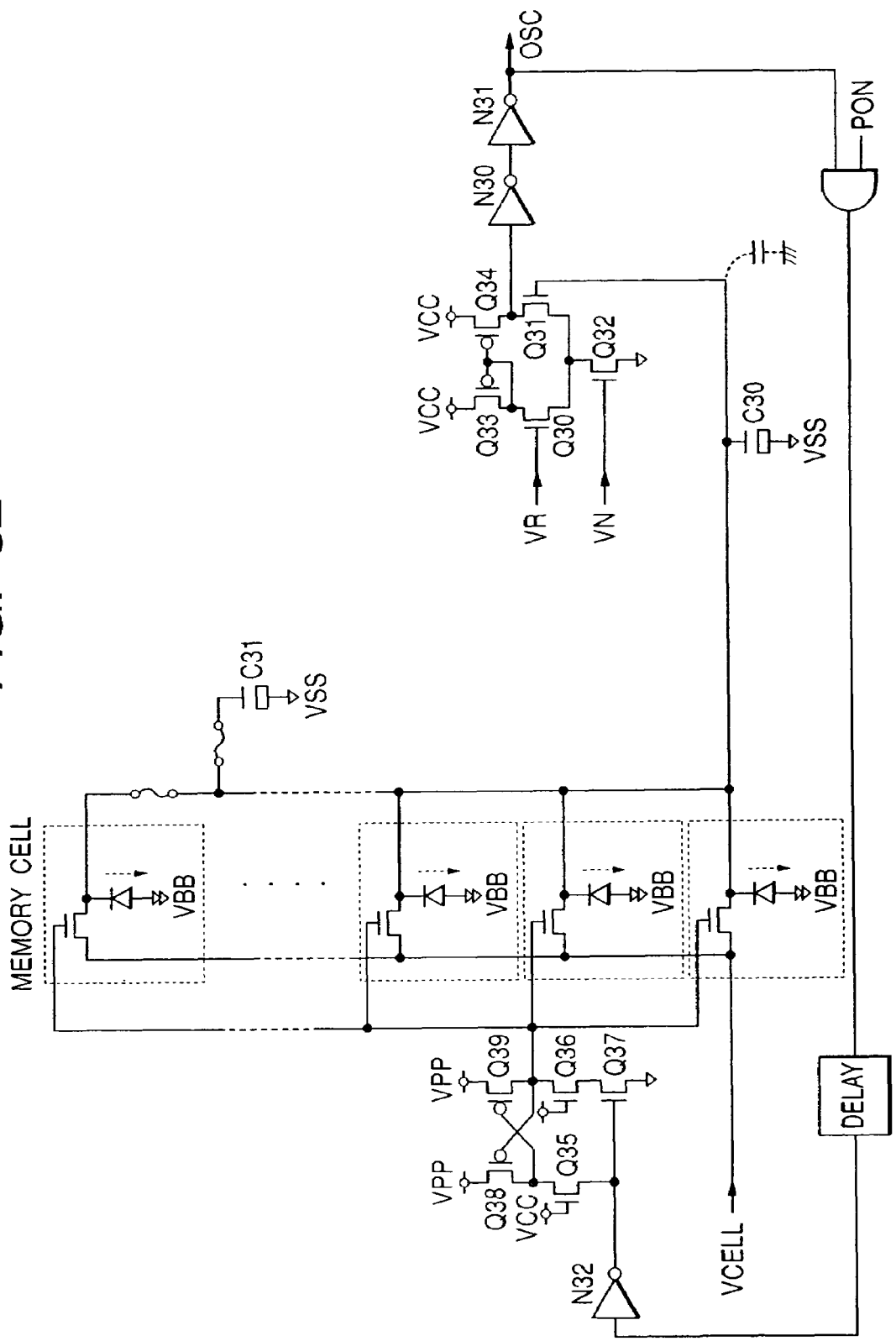
FIG. 32 is a circuit diagram showing an example of an oscillator using the cell leak monitor used for the invention.

FIG. 32 is a circuit diagram showing an example of an oscillator using the cell leak monitor used for the invention. A junction leak source is formed in a memory cell size. However, in the case of only one bit, as shown in FIG. 8, the junction leak current varies in digits, so that it is difficult to make adjustment by using trimming means. In the cell leak monitor, at least 10 bits are connected in parallel so as to obtain a PN junction leak characteristic of around 50% fail. The cycle can be adjusted by the voltage VCELL (write voltage) and voltage VR (reference potential) in FIG. 31, the number of cells to be connected, and parasite capacitance.

When the voltage of the capacitor C30 (C31) drops below the reference voltage VR, the MOSFET Q30 of a voltage comparing circuit is turned on to set an output signal OSC obtained via inverters N30 and N31 to the high level. The output signal is sent to a delay circuit via an AND gate which opens at the high level of a power-on signal PON to be described hereinlater, and a low-level signal is generated by an inverter N32. The low-level signal is boosted to a boosted voltage by a level shifter constructed by the MOSFETs Q35 to Q39. The signal is sent to the gate of the switch MOSFET constructing a dummy cell to turn on the MOSFETs.

By turning on the MOSFETs, the voltage VCELL is written in the capacitor C30. As a result, the signal OSC obtained via the voltage comparing circuit and the inverters N30 and N31 goes low, the output signal of the AND gate accordingly goes low, the output signal of the inverter N32 goes high after delay time of the delay circuit, the output signal of the level shifter goes low, and the switch MOSFET is turned off. Consequently, the storage node of the capacitor C30 enters a floating state, so that a charge holding state is set. The charge is discharged by a source-drain junction leak of the switch MOSFET in a manner similar to a memory cell.

In the cell leak monitor, excess PN junction should not be parasite for the reason that the PN junction becomes a leak source and the temperature dependency will not stay in adjustment. After confirming the completion of the start of the internal power source by the high level of the power-on signal PON, that is, after completion of the startup of the internal power source until the operation voltage VPP of the level shifter reaches a desired high voltage, data is rewritten to the capacitor C30 as the junction leak source. With the configuration, it becomes applicable also in the sleep mode.

The cell leak monitor can be realized by masking a tail bit by using the ECC circuit. The temperature dependency of the tail bit and that of a normal bit are largely different from each other. The temperature dependency (activation energy) of a normal bit is twice as large as that of a tail bit. Moreover, the probability of occurrence is 0.01% or less. Consequently, a leak source cannot be formed stably. Even if it is devised as shown in FIG. 32, it does not mean anything for a tail bit. By masking the tail bit by using the ECC circuit, a cell leak monitor in which the characteristics of a normal bit are reflected can be used. By the combination of the cell leak monitor as shown in FIG. 32 with the ECC circuit, the cell leak monitor becomes meaningful as a leak source.

FIGS. 33A, 33B, and 33C are schematic diagrams of carrier generating mechanisms. FIG. 33C show a factor of dominance of the tail bit, and FIG. 33B show a factor of dominance of the normal bit.

FIG. 34 is an operation waveform chart of a basic OCS as an example of a cell leak monitor method according to the invention. When the refresh pulse OSC goes high, start-up of the internal source is instructed by an internal source start-up signal. After elapse of the time tPON set for the start-up, all bits are cencentratedly refreshed. Concurrently, the capacitor C30 in the cell leak monitor as shown in FIG. 32 is charged up.

A pulse SOSC2 for concentrated refresh is generated by a ring oscillator using an RC time constant circuit separately provided or the like. After completion of the concentrated refresh, out of the internal sources, the source voltages of circuits which are not related to the data storing operation are interrupted by an internal source voltage stop signal. By the oscillation signal OCS using the cell leak monitor as described above, synchronously with the refresh cycle which is as long as about 10 seconds at a room temperature, the operations of start-up of the internal power source, concentrated refresh, and interruption of the internal power source are repeated.

Figure 35:
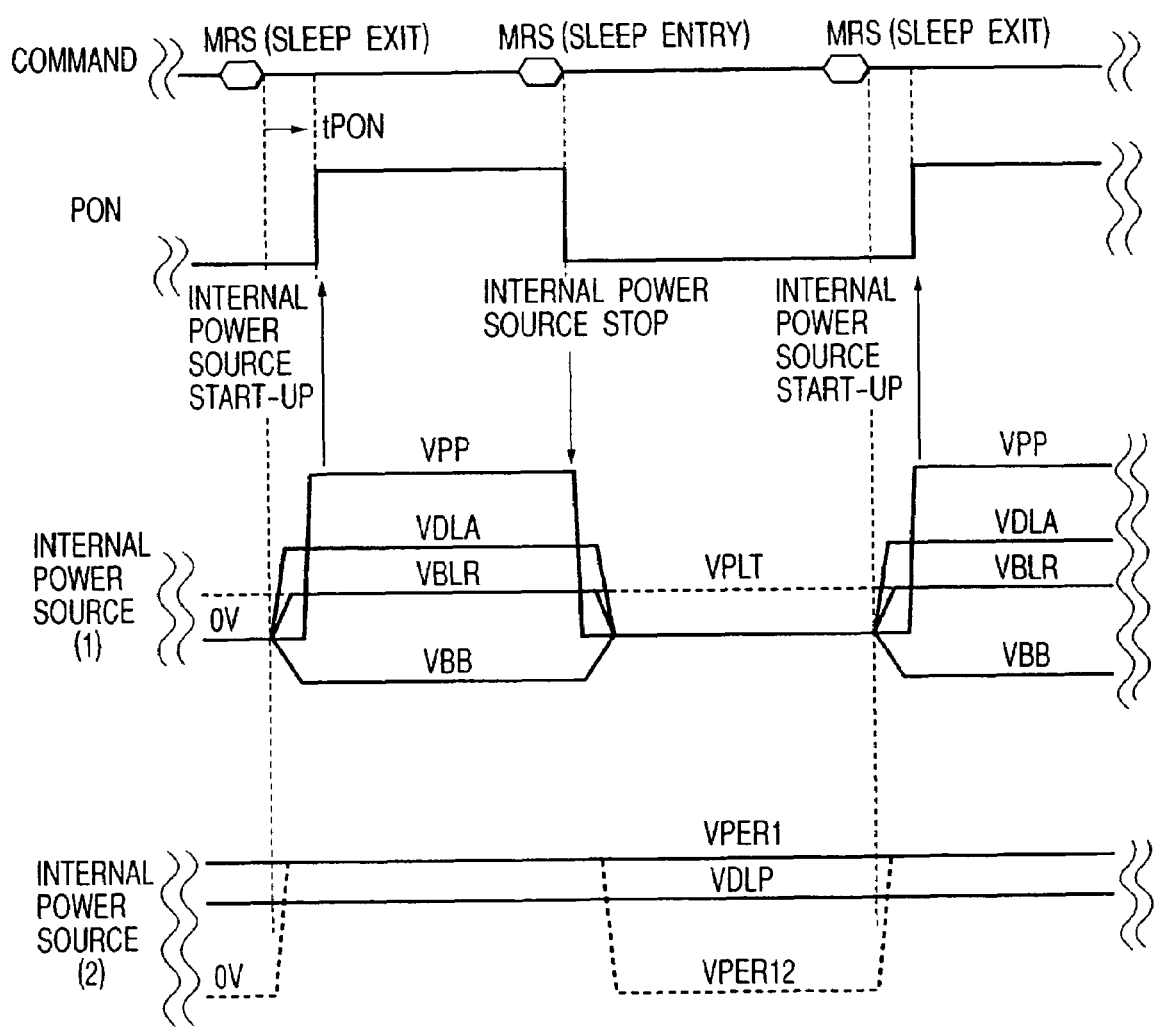
FIG. 35 is a waveform chart for explaining an internal power source control operation in a sleep mode (super low power mode) in the DRAM according to the invention.

FIG. 35 is a waveform chart for explaining the internal power source controlling operation in the sleep mode (super low power mode) in the DRAM according to the invention. The example is characterized by the following two points. (1) The plate voltage VPLT is not dropped to prevent data from being destroyed by a plate bump. (2) The word line boosted voltage VPP is boosted after the power sources (VPERI and VDLA) of the word driver control circuit are started, and is dropped before the power sources (VPERI and VLDA) of the word driver control circuit are interrupted in order to prevent data from being destroyed by word line noise.

The internal voltage VDLA is a voltage up to 1.8V of the internal step-down power source of a memory array and can be dropped. In contrast, the internal voltage VDLB is a voltage up to 1.8V of the internal step-down power source of a peripheral circuit and cannot be dropped since it is used for the basic OCS or the like. VPERI2 is a voltage which can be dropped, supplied to a peripheral circuit and is up to 2.4V. Although not limited, VPP is a voltage up to 3.4V, VPERI is a voltage up to 2.4V, and VBLR=VPLT=VDL/2 is a voltage up to 0.8V.

In the DRAM, in order to increase the capacitance value of a storage capacitor in a finer device, a capacitance film (insulating film) is formed thinly, so that a margin on the withstand voltage and reliability of the capacitance film is narrow. When the plate voltage VPLT is set to be equal to VSS, plate bump caused by stopping the power source does not occur. However, when high-level data is held, the reliability of the capacitance film decreases in digits (and the plate leak increases). Since doze in a recent device is high, the substrate effect is small. When a negative potential floats to 0V naturally, there is little harm. By setting VBB to be equal to VSS as in the example, the power consumption is reduced.

Figure 36:
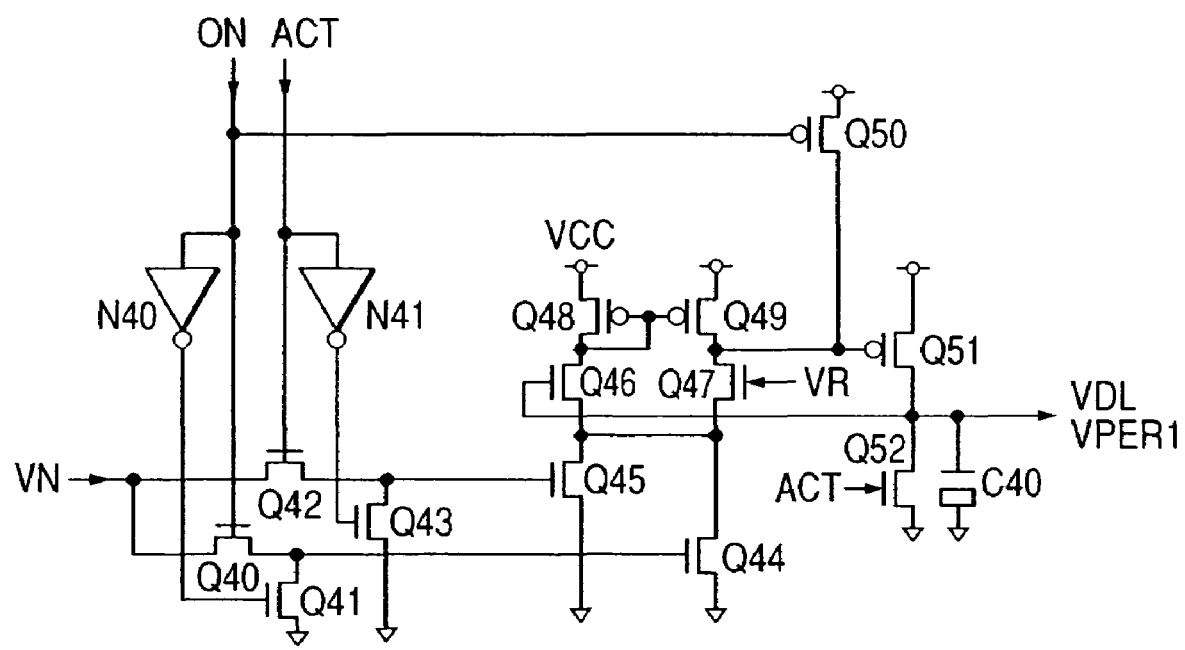
FIG. 36 is a circuit diagram showing an example of an internal step-down power source provided for the DRAM according to the invention.

FIG. 36 is a circuit diagram of an example of the internal step-down power source provided for the DRAM according to the invention. The internal step-down power source serves as a voltage follower circuit for comparing the reference voltage VR and the output voltage VDL (VPERI) with each other and performing a control so that the voltages are equal to each other. The reference voltage VR is set to a desired voltage VDL or VPERI.

The current source of a differential amplifier constructed by MOSFETs Q44 to Q49 is controlled by a signal ACT. When the signal ACT is at the H level, the current source is made active to pass a relatively high current by the MOSFET Q45, thereby achieving high response. However, a DC current is largely consumed. In contrast, when the signal ACT is at the low level, the standby mode is set. When a relatively low current is passed to the MOSFET Q44, although the response is slow, the DC current consumption is reduced. When the signal ON goes low, the P-channel type MOSFET Q51 as an output of the differential amplifier is made inactive to thereby set the sleep mode.

The working effects obtained by the foregoing examples are as follows.

(1) When a DRAM enters an operation mode for performing only an operation of retaining data, a check bit for error detection and correction is generated for plural data and stored, and a refresh operation is performed in a refresh cycle extended in a permissible range of error occurrence by an error correcting operation using the check bit. Before the DRAM returns to the normal operation from the data retaining operation, an error bit is corrected by using the data and the check bit, thereby enabling an error in a tail bit to be corrected. Thus, effects such that a long refresh cycle is achieved and, since no ECC operation is performed, the power consumption can be largely reduced are produced.

(2) In addition, the plural data and the check bit are stored in a dynamic RAM, and the error detecting and correcting operation using the check bit is performed by a built-in error detecting and correcting circuit. Consequently, an effect such that the usability is increased is obtained.

(3) A semiconductor integrated circuit device has: a memory circuit including a dynamic memory cell and having an information retaining mode during which data is not read/written from/to other circuits; and a data retention control circuit including an ECC circuit and a refresh cycle setting circuit. When the dynamic RAM enters an operation mode of performing only an operation of retaining data, for plural data, a check bit for error detection and correction is generated and stored by using the ECC circuit. The refresh cycle is extended by the refresh cycle setting circuit within a permissible range of error occurrence by an error correcting operation using the check bit. Before the DRAM returns from the information retaining mode to a normal operation mode, an error bit in data is corrected by using the data and the check bit by the ECC circuit, thereby enabling an error in a tail bit to be corrected. Thus, effects such that the long refresh cycle is achieved and, moreover, since no ECC operation is performed, the power consumption can be largely reduced are produced.

(4) In addition, the check bit is stored in a memory cell included in the memory circuit. Consequently, an effect such that increased usability is achieved and the circuit is simplified is obtained.

(5) In addition, the ECC circuit can correct two bits or more by using a cyclic code, allows data and a check bit to be stored in a memory cell read by an operation of selecting one of word lines in the memory circuit, and reads/writes data and check bits corresponding to the one word line. Thus, an effect such that the generation and storage of the check bit and the correction of the error bit can be performed at high speed with a simple configuration is produced.

Although the invention achieved by the present inventor has been concretely described on the basis of the examples, obviously, the invention is not limited to the foregoing examples and can be variously changed without departing from the gist. For example, as the memory circuit, any memory circuit may be used as long as it uses a dynamic memory cell as described above. Except for the two-intersection architecture as described above, the memory array portion may have what is called a single-intersection architecture or open bit line architecture in which complementary bit lines are extended on the right and left sides by using the sense amplifier as a center.

The area for storing the parity bit may not be specially provided but a data area may be limited to assure an area for predetermined parity bits by software. Specifically, an area for parity bits is assured in correspondence with the built-in ECC circuit in advance. When the DRAM enters the data retaining mode, the ECC circuit is used by being activated. The case of using such a built-in ECC circuit is preferable for a small-scale system.

In a large-scale system, necessary data in data stored in the DRAM can be saved in a nonvolatile memory such as an SRAM or a magnetic memory. Consequently, it is unnecessary for the DRAM to perform the data retaining operation. In the large-scale system, therefore, it is more advantageous when the area for parity bits of the DRAM can be used for storing data. A DRAM in which a dedicated parity bit area is not provided for a memory array can be therefore properly used in accordance with a small-scale system and a large-scale system.

The data storing method of the DRAM according to the invention as described above can be executed not only by using the ECC circuit built in the DRAM but also by software in a microcomputer system. When a CPU itself enters a sleep mode, data in the DRAM is read, a parity bit is generated by an ECC operation as described above and stored in the DRAM or SRAM, and a self refresh operation in a long cycle as described above is instructed. When the CPU returns from the sleep mode, data of the DRAM and the corresponding parity bit are read, and an error of the DRAM, which occurs in the data retaining state is corrected. In order to manage the data retaining operation by the CPU or the like, in place of the operation of the sleep mode, a function of managing the refresh by the CPU or the like may be added.

The invention can be applied not only to the DRAM chip like an SDRAM but also a semiconductor integrated circuit device on which a DRAM is mounted like a system LSI. The invention can be widely used for the data storing method of the DRAM and the semiconductor integrated circuit device including the DRAM.

Effects obtained by a representative one of the inventions disclosed in the application will be briefly described as follows. When a DRAM enters an operation mode for performing only an operation of retaining data, a check bit for error detection and correction is generated for plural data and stored, and a refresh operation is performed in a refresh cycle extended in a permissible range of error occurrence by an error correcting operation using the check bit. Before the DRAM returns to the normal operation from the data retaining operation, an error bit is corrected by using the data and the check bit, thereby enabling an error in a tail bit to be corrected. Thus, along refresh cycle is achieved and, since no ECC operation is performed, the power consumption can be largely reduced.

A semiconductor integrated circuit device has: a memory circuit including a dynamic memory cell and having an in formation retaining mode during which data is not read/ written from/to other circuits; and a data retention control circuit including an ECC circuit and a refresh cycle setting circuit. When the dynamic RAM enters an operation mode of performing only an operation of retaining data, for plural data, a check bit for error detection and correction is generated and stored by using the ECC circuit. The refresh cycle is extended by the refresh cycle setting circuit within a permissible range of error occurrence by an error correcting operation using the check bit. Before the DRAM returns from the information retaining mode to a normal operation mode, an error bit in data is corrected by using the data and the check bit by the ECC circuit, thereby enabling an error in a tail bit to be corrected. Thus, a long refresh cycle is achieved and, moreover, since no ECC operation is performed, the power consumption can be largely reduced.

We claim:

1. A semiconductor integrated circuit device comprising:
a memory circuit having a normal operation mode for data reading and writing, and a data retention mode; and
a data retention control circuit activated when the memory circuit enters the data retention mode, to perform a first operation of reading plural data stored in the memory circuit and generating and storing a check bit for error detection and correction, and activated when the memory circuit returns from the data retention mode to the normal operation mode, to perform a second operation of reading stored data and the stored check bit, correcting an error bit in the data, and writing corrected data into the memory circuit,
wherein in at least one refresh cycle of a refresh operation in the data retention mode, memory cells of the memory circuit are refreshed but an operation of error detection and correction is not performed and the refresh cycle is extended in an ECC correctable range.

2. The semiconductor integrated circuit device according to claim 1, wherein the data retention control circuit includes a refresh cycle setting circuit that sets the length of refresh cycles.

3. The semiconductor integrated circuit device according to claim 2, wherein the refresh cycle setting circuit adjusts the length of refresh cycles in accordance with temperature of the semiconductor integrated circuit device.

4. The semiconductor integrated circuit device according to claim 2, wherein the refresh cycle setting circuit includes a cell leak monitor that sets refresh cycles longer than refresh cycles of the normal operation mode.

* * * * *